US012604556B2

(12) United States Patent
Zhao et al.

(10) Patent No.: US 12,604,556 B2
(45) Date of Patent: Apr. 14, 2026

(54) PHOTONIC MATERIALS

(71) Applicant: Ohio State Innovation Foundation, Columbus, OH (US)

(72) Inventors: Hongping Zhao, Columbus, OH (US); Kaitian Zhang, Columbus, OH (US)

(73) Assignee: Ohio State Innovation Foundation, Columbus, OH (US)

( * ) Notice: Subject to any disclaimer, the term of this patent is extended or adjusted under 35 U.S.C. 154(b) by 617 days.

(21) Appl. No.: 17/984,333

(22) Filed: Nov. 10, 2022

(65) Prior Publication Data

US 2023/0223484 A1     Jul. 13, 2023

Related U.S. Application Data

(60) Provisional application No. 63/299,294, filed on Jan. 13, 2022.

(51) Int. Cl.
H01L 33/06 (2010.01)
B82Y 20/00 (2011.01)
(Continued)

(52) U.S. Cl.
CPC ........ H10F 77/12485 (2025.01); B82Y 20/00 (2013.01); H10F 77/143 (2025.01); H10H 20/812 (2025.01)

(58) Field of Classification Search
CPC ........... H10H 20/825; H10H 20/01335; H10H 20/01; H10H 20/818; H10H 20/817; H10H 20/815; H10H 20/821; H10H 20/812; H10H 20/8215; H10H 20/81; H10F 77/12485; H10F 77/124; H10F 77/143; H10F 77/14;
(Continued)

(56) References Cited

U.S. PATENT DOCUMENTS 5,408,487 A     4/1995 Uchida et al.
8,124,432 B2     2/2012 Tsuchiya et al.
(Continued)

FOREIGN PATENT DOCUMENTS

CN          1929153 A     3/2007

OTHER PUBLICATIONS

Alhassan, Abdullah I., et al. "High luminous efficacy green light-emitting diodes with AlGaN cap layer." Optics express 24.16 (2016): 17868-17873.
(Continued)

*Primary Examiner* — Nikolay K Yushin

(74) *Attorney, Agent, or Firm* — Meunier Carlin & Curfman LLC

(57) ABSTRACT

Disclosed herein are photonic materials. The photonic materials comprise a first layer, a second layer, and a third layer, wherein the second layer is disposed between and in contact with the first layer and the third layer, such that the second layer is sandwiched between the first layer and the third layer. In some examples, the first layer comprises $In_yGa_{1-y}N$, wherein y is from 0 to 0.8. In some examples, the second layer comprises $(Zn_aSn_bGe_c)_xGa_dN_2$, wherein: x is from greater than 0 to 1; a, b, c, and d are each independently from 0 to 1; with the proviso that at least one of a, b, or c is greater than 0. In some examples, the third layer comprises $In_zGa_{1-z}N$, wherein z is from 0 to 0.8.

18 Claims, 14 Drawing Sheets

(51) Int. Cl.

| | |
|---|---|
| *H01L 31/0352* | (2006.01) |
| *H10F 77/124* | (2025.01) |
| *H10F 77/14* | (2025.01) |
| *H10H 20/812* | (2025.01) |

(58) Field of Classification Search
CPC ........ H10F 77/12; H10F 77/146; H10F 71/00;
H10F 19/33; H10F 19/80; H10F 19/904;
H10F 19/31; H10F 19/90; H10F 39/00;
H10F 39/195; H10F 39/12; H10F
39/8037; B82Y 20/00; B82Y 20/812;
B82Y 20/9251; B82Y 20/8215; H01S
5/34333; H01S 5/343; H01S 5/1441;
H01S 5/18341; H01S 5/1032

See application file for complete search history.

(56) References Cited

U.S. PATENT DOCUMENTS

| | | |
|---|---|---|
| 11,355,668 B2 | 6/2022 | Zhao et al. |
| 2007/0145397 A1 | 6/2007 | Denbaars et al. |
| 2008/0128730 A1 | 6/2008 | Fellows et al. |
| 2013/0240026 A1 | 9/2013 | Atwater et al. |

OTHER PUBLICATIONS

Arif, Ronald A., et al. "Spontaneous emission and characteristics of staggered InGaN quantum-well light-emitting diodes." IEEE Journal of Quantum Electronics 44.6 (2008): 573-580.

Arif, Ronald A., Hongping Zhao, and Nelson Tansu. "Type-II InGaN—GaNAs quantum wells for lasers applications." Applied Physics Letters 92.1 (2008): 011104.

Bernardini, Fabio, Vincenzo Fiorentini, and David Vanderbilt. "Accurate calculation of polarization-related quantities in semiconductors." Physical Review B 63.19 (2001): 193201.

Damilano, Benjamin, and Bernard Gil. "Yellow-red emission from (Ga, In) N heterostructures." Journal of Physics D: Applied Physics 48.40 (2015): 403001.

Department of Energy Solid-State Lighting R&D Plan, Jun. 2016, 209 pages.

DOE BTO Solid-State Lighting Program, "2022 DOE SSL R&D Opportunities,". Feb. 2022. 201 pages.

Farrell, Robert M., et al. "Continuous-wave operation of AlGaN-cladding-free nonpolar m-plane InGaN/GaN laser diodes." Japanese Journal of Applied Physics 46.8L (2007): L761.

Feldberg, N., et al. "Growth, disorder, and physical properties of ZnSnN2." Applied Physics Letters 103.4 (2013): 042109.

Feldberg N et al., "ZnSnN2: A new earth-abundant element semiconductor for solar cells," 2012 38th IEEE Photovoltaic Specialists Conference, 2012, pp. 002524-002527.

Fragkos, Ioannis E., et al. "Pathway towards high-efficiency Eu-doped GaN light-emitting diodes." Scientific reports 7.1 (2017): 14648.

Fragkos, Ioannis E., and Nelson Tansu. "Surface plasmon coupling in GaN: Eu light emitters with metal-nitrides." Scientific Reports 8.1 (2018): 13365.

Han, Lu, Kathleen Kash, and Hongping Zhao. "Designs of blue and green light-emitting diodes based on type-II InGaN—ZnGeN2 quantum wells." Journal of Applied Physics 120.10 (2016): 103102.

Hangleiter, Andreas, et al. "Suppression of nonradiative recombination by V-shaped pits in GaInN/GaN quantum wells produces a large increase in the light emission efficiency." Physical review letters 95.12 (2005): 127402.

Heikenfeld, J., et al. "Low-voltage GaN: Er green electroluminescent devices." Applied Physics Letters 76.11 (2000): 1365-1367.

Jaroenjittichai et al. "Band offsets between ZnGeN 2, GaN, ZnO, and ZnSnN 2 and their potential impact for solar cells." Phys. Rev. B 88, 075302 (2013).

Jaroenjittichai et al. "Erratum: Band offsets between ZnGeN 2, GaN, ZnO, and ZnSnN 2 and their potential impact for solar cells [Phys. Rev. B 88, 075302 (2013)]." Physical Review B 96.7 (2017): 079907.

Jiang, Fengyi, et al. "Efficient InGaN-based yellow-light-emitting diodes." Photonics Research 7.2 (2019): 144-148.

Karim, Md Rezaul, et al. "Band Structure Engineering Based on InGaN/ZnGeN2 Heterostructure Quantum Wells for Visible Light Emitters." Crystal Growth & Design 22.1 (2021): 131-139.

Karim, Md Rezaul, et al. "Experimental determination of the valence band offsets of ZnGeN2 and (ZnGe) 0.94 Ga0. 12N2 with GaN." Journal of Physics D: Applied Physics 54.24 (2021): 245102.

Karim, Md Rezaul, and Hongping Zhao. "Design of InGaN—ZnSnN2 quantum wells for high-efficiency amber light emitting diodes." Journal of Applied Physics 124.3 (2018): 034303.

Keller, Stacia, et al. "Recent progress in metal-organic chemical vapor deposition of N-polar group-III nitrides." Semiconductor Science and Technology 29.11 (2014): 113001.

Kim, Kwang-Choong, et al. "Improved electroluminescence on nonpolar m-plane InGaN/GaN quantum wells LEDs." physica status solidi (RRL)—Rapid Research Letters 1.3 (2007): 125-127.

Lambrecht WRL et al. "Heterovalent ternary II-IV-N2 compounds: perspectives for a new class of wide-band-gap nitrides," Chapter 15 (pp. 519-585) in III-Nitride Semiconductors and Their Modern Devices, Edited by Bernard Gil, Oxford Science Publications, (Oxford University Press, Oxford, UK), 2013.

Lv, Quanjiang, et al. "Realization of highly efficient InGaN green LEDs with sandwich-like multiple quantum well structure: role of enhanced interwell carrier transport." ACS Photonics 6.1 (2018): 130-138.

Marcinkevičius, Saulius, et al. "High internal quantum efficiency of long wavelength InGaN quantum wells." Applied Physics Letters 119.7 (2021): 071102.

Martinez, Aaron D., et al. "Synthesis, structure, and optoelectronic properties of II- IV-V 2 materials." Journal of Materials Chemistry A 5.23 (2017): 11418-11435.

Morishima, S., et al. "Growth of Eu doped GaN and electroluminescence from MIS structure." physica status solidi (a) 176.1 (1999): 113-117.

Park, Jongwoon, and Yoichi Kawakami. "Photoluminescence property of InGaN single quantum well with embedded AlGaN & layer." Applied Physics Letters 88.20 (2006): 202107.

Park, S.-H., Park, J., & Yoon, E. (2007). Optical gain in InGaN/GaN quantum well structures with embedded AlGaN & layer. Applied Physics Letters, 90(2), 023508. doi:10.1063/1.2431477.

Park, S.-H., Ahn, D., & Kim, J.-W. (2009). High-efficiency staggered 530 nm InGaN/InGaN/GaN quantum-well light-emitting diodes. Applied Physics Letters, 94(4), 041109. doi:10.1063/1.3075853.

Park, Seoung-Hwan, Yong-Tak Lee, and Jongwoon Park. "Optical properties of type-II InGaN/GaAsN/GaN quantum wells." Optical and quantum electronics 41 (2009): 779-785.

Park, S.-H., & Chuang, S.-L. (1999). Crystal-orientation effects on the piezoelectric field and electronic properties of strained wurtzite semiconductors. Physical Review B, 59(7), 4725-737. D doi:10. 1103/physrevb.59.4725.

Punya, Atchara, Tula R. Paudel, and Walter RL Lambrecht. "Electronic and lattice dynamical properties of II-IV-N2 semiconductors." physica status solidi c 8.7-8 (2011): 2492-2499.

Punya, Atchara, and Walter RL Lambrecht. "Band offsets between ZnGeN 2, GaN, ZnO, and ZnSnN 2 and their potential impact for solar cells." Physical Review B 88.7 (2013): 075302.

Punya, Atchara, Walter RL Lambrecht, and Mark Van Schilfgaarde. "Quasiparticle band structure of Zn-IV-N 2 compounds." Physical Review B 84.16 (2011): 165204.

Schmidt, Mathew C., et al. "Demonstration of nonpolar m-plane InGaN/GaN laser diodes." Japanese journal of applied physics 46.3L (2007): L190.

Timmerman, Dolf, et al. "Excitation Efficiency and Limitations of the Luminescence of Eu 3+ Ions in Ga N." Physical Review Applied 13.1 (2020): 014044.

Vurgaftman, I., and JR N. Meyer. "Band parameters for nitrogen-containing semiconductors." Journal of Applied Physics 94.6 (2003): 3675-3696.

(56)　　　　　　References Cited

OTHER PUBLICATIONS

Vurgaftman et al. Nitride Semicond. Devices Princ. Simul. John Wiley & Sons, Ltd, 2007, pp. 13-48.

Wu, X. H., et al. "Structural origin of V-defects and correlation with localized excitonic centers in InGaN/GaN multiple quantum wells." Applied Physics Letters 72.6 (1998): 692-694.

Zhang, Kaitian, et al. "Pulsed-Mode MOCVD Growth of ZnSn (Ga) N2 and Determination of the Valence Band Offset with GaN." Crystal Growth & Design 22.8 (2022): 5004-5011.

Zhao, Hongping, Ronald A. Arif, and Nelson Tansu. "Design analysis of staggered InGaN quantum wells light-emitting diodes at 500-540 nm." IEEE Journal of selected topics in quantum electronics 15.4 (2009): 1104-111.

Zhao, Hongping, Guangyu Liu, and Nelson Tansu. "Analysis of InGaN-delta-InN quantum wells for light-emitting diodes." Applied Physics Letters 97.13 (2010): 131114.

Zhao, Hongping, et al. "Approaches for high internal quantum efficiency green InGaN light-emitting diodes with large overlap quantum wells." Optics express 19.104 (2011): A991-A1007.

Zhao, Hongping, et al. "Optical gain analysis of strain-compensated InGaN—AlGaN quantum well active regions for lasers emitting at 420-500 nm." Optical and quantum electronics 40 (2008): 301-306.

Zhao, Hongping, et al. "Self-consistent analysis of strain-compensated InGaN—AlGaN quantum wells for lasers and light-emitting diodes." IEEE Journal of Quantum Electronics 45.1 (2008): 66-78.

International Search Report and Written Opinion mailed Feb. 7, 2023 in related International Application No. PCT/US2022/049500 (8 pages).

PHOTONIC MATERIALS

CROSS-REFERENCE TO RELATED APPLICATIONS

This application claims the benefit of priority to U.S. Provisional Application No. 63/299,294, filed Jan. 13, 2022, which is hereby incorporated herein by reference in its entirety.

STATEMENT OF GOVERNMENT SUPPORT

This invention was made with government support under grant/contract number DE-EE0008718 awarded by the U.S. Department of Energy. The government has certain rights in the invention.

BACKGROUND

Although extensive research has resulted in close to 100% external quantum efficiency (EQE) of InGaN based blue light emitting diodes (LEDs), efficiency of the longer visible wavelength InGaN based light emitters has remained relatively low. The compositions, methods, and systems discussed herein addresses these and other needs.

SUMMARY

In accordance with the purposes of the disclosed compositions, methods, and systems as embodied and broadly described herein, the disclosed subject matter relates to photonic materials and methods of use thereof.

For example, disclosed herein are high efficiency LED designs using quantum well engineering.

Disclosed herein are photonic materials. The photonic materials comprise a first layer, a second layer, and a third layer, wherein the second layer is disposed between and in contact with the first layer and the third layer, such that the second layer is sandwiched between the first layer and the third layer. In some examples, the first layer comprises $In_yGa_{1-y}N$, wherein y is from 0 to 0.8. In some examples, the second layer comprises $(Zn_aSn_bGe_c)_xGa_dN_2$, wherein: x is from greater than 0 to 1; a, b, c, and d are each independently from 0 to 1; with the proviso that at least one of a, b, or c is greater than 0. In some examples, the third layer comprises $In_zGa_{1-z}N$, wherein z is from 0 to 0.8.

In some examples, y and/or z is from 0.1 to 0.5, from 0.1 to 0.3, or wherein y and/or z is 0.2.

In some examples, the first layer has a first average thickness of from 0.1 nm to 5 nm. In some examples, the first layer has a first average thickness of from 1 nm to 3 nm.

In some examples, the second layer has a second average thickness of from 0.1 nm to 5 nm. In some examples, the second layer has a second average thickness of from 0.5 nm to 0.7 nm.

In some examples, the second layer comprises $(ZnSn)_{0.5}GaN_2$.

In some examples, d is equal to 1-x, such that the second layer comprises $(Zn_aSn_bGe_c)_xGa_{1-x}N_2$.

In some examples, the second layer comprises $(ZnSn)_{0.5}Ga_{0.5}N_2$.

In some examples, the third layer has a third average thickness of from 0.1 nm to 5 nm.

In some examples, the third layer has a third average thickness of from 1 nm to 3 nm.

In some examples, the photonic material has an average composite thickness of from 0.5 nm to 10 nm, wherein the average composite thickness is the sum of the first average thickness, the second average thickness, and the third average thickness. In some examples, the average composite thickness is from 1 nm to 5 nm, from 2.5 nm to 5 nm, or from 4 nm to 5 nm.

In some examples, the photonic material further comprises a fourth layer disposed on the third layer, such that the third layer is sandwiched between the second layer and the fourth layer, wherein the fourth layer comprises $Al_wGa_{1-w}N$ and w is from 0 to 1. In some examples, w is from 0.1 to 0.5 or from 0.1 to 0.3. In some examples, w is 0.2.

In some examples, the fourth layer has a fourth average thickness of from 0.5 nm to 5 nm. In some examples, the fourth layer has a fourth average thickness of from 0.5 nm to 4 nm, from 1 nm to 2 nm, or from 1.4 nm to 1.6 nm.

In some examples, the photonic material further comprises a fifth layer disposed on the fourth layer, such that the fourth layer is sandwiched between the fifth layer and the third layer, wherein the fifth layer comprises GaN. In some examples, the fifth layer has a fifth average thickness of from 1 nm to 15 nm.

In some examples, the photonic material further comprises a sixth layer disposed on the first layer, such that the first layer is sandwiched between the sixth layer and the second layer, wherein the sixth layer comprises GaN. In some examples, the sixth layer has a sixth average thickness of from 1 nm to 15 nm.

In some examples, the photonic material has an electron wavefunction with a first confined state and a hole wavefunction with a first confined state, and wherein the overlap of the electron wavefunction and the hole wavefunction in the first confined state in the photonic material is 1% or more, 5% or more, 15% or more, or 20% or more.

In some examples, the photonic material has a spontaneous emission spectrum with a peak wavelength of 500 nm or more, 550 nm or more, 600 nm or more, 650 nm or more, 700 nm or more, 1000 nm or more, or 1200 nm or more. In some examples, the photonic material has a spontaneous emission spectrum with a peak wavelength of from 580 nm to 600 nm.

In some examples, the photonic material exhibits a strong hole confinement in the second layer.

In some examples, the photonic material has a spontaneous emission recombination rate per unit volume of $1 \times 10^{25}$ $s^{-1}$ $cm^{-3}$ or more at a carrier concentration of from $1 \times 10^{18}$ $cm^{-3}$ to $5 \times 10^{18}$ $cm^{-3}$.

In some examples, the spontaneous emission spectrum of the photonic material exhibits a peak wavelength of 500 nm or more and the peak wavelength has an intensity of $1 \times 10^{25}$ $s^{-1}$ $cm^{-3}$ $eV^{-1}$ or more at a carrier concentration of from $1 \times 10^{18}$ $cm^{-3}$ to $5 \times 10^{18}$ $cm^{-3}$.

In some examples, the phonic material comprises a quantum well structure.

Also disclosed herein are light emitting diodes (LEDs) comprising a quantum well structure comprising any of the photonic materials disclosed herein.

Also disclosed herein are methods of use of any of the photonic materials disclosed herein, the methods comprising using the photonic material in a semiconductor laser, a photovoltaic device, a solar cell, a photodetector, or the like.

Also disclosed herein are methods of making any of the photonic materials disclosed herein. In some examples, the methods can comprise MOCVD, such as pulsed MOCVD.

Additional advantages of the disclosed systems and methods will be set forth in part in the description which follows, and in part will be obvious from the description. The advantages of the disclosed systems and methods will be realized and attained by means of the elements and combinations particularly pointed out in the appended claims. It is to be understood that both the foregoing general description and the following detailed description are exemplary and explanatory only and are not restrictive of the disclosed systems and methods, as claimed.

The details of one or more embodiments of the invention are set forth in the accompanying drawings and the description below. Other features, objects, and advantages of the invention will be apparent from the description and drawings, and from the claims.

BRIEF DESCRIPTION OF THE FIGURES

The accompanying figures, which are incorporated in and constitute a part of this specification, illustrate several aspects of the disclosure, and together with the description, serve to explain the principles of the disclosure.

DETAILED DESCRIPTION

Figure 1:
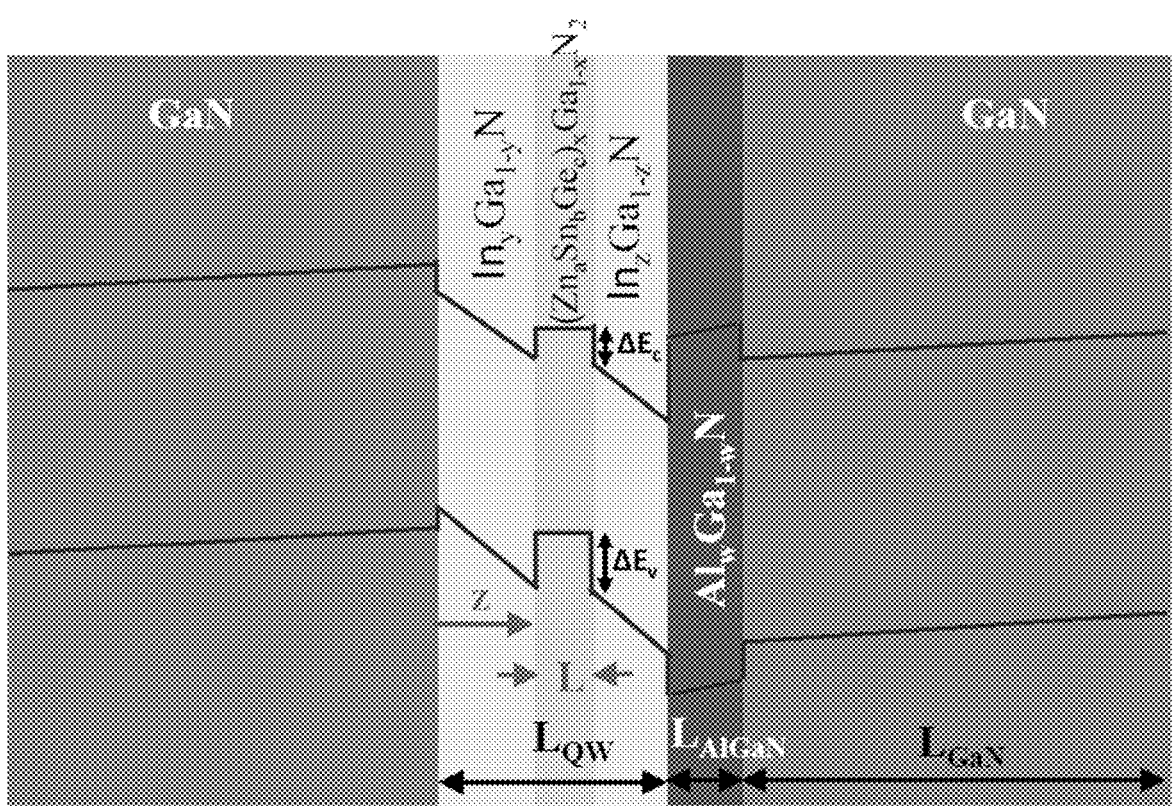
FIG. 1. Schematic diagram of an $In_yGa_{1-y}N/(Zn_aSn_b$ $Ge_c)_xGa_{1-x}N_2/In_zGa_{1-z}N$ quantum well (QW) with the width of the QW ($L_{QW}$), the position of the ZnSnGeGaN layer (z), and the thickness of the ZnSnGeGaN layer (L). The barriers surrounding the QW can be GaN, and/or $Al_wGa_{1-w}N/GaN$.

The compositions, methods, and systems described herein may be understood more readily by reference to the following detailed description of specific aspects of the disclosed subject matter and the Examples included therein.

Before the present compositions, methods, and systems are disclosed and described, it is to be understood that the aspects described below are not limited to specific synthetic methods or specific reagents, as such may, of course, vary. It is also to be understood that the terminology used herein is for the purpose of describing particular aspects only and is not intended to be limiting.

Also, throughout this specification, various publications are referenced. The disclosures of these publications in their entireties are hereby incorporated by reference into this application in order to more fully describe the state of the art to which the disclosed matter pertains. The references disclosed are also individually and specifically incorporated by reference herein for the material contained in them that is discussed in the sentence in which the reference is relied upon.

General Definitions

In this specification and in the claims that follow, reference will be made to a number of terms, which shall be defined to have the following meanings.

Throughout the description and claims of this specification the word "comprise" and other forms of the word, such as "comprising" and "comprises," means including but not limited to, and is not intended to exclude, for example, other additives, components, integers, or steps.

As used in the description and the appended claims, the singular forms "a," "an," and "the" include plural referents unless the context clearly dictates otherwise. Thus, for example, reference to "a composition" includes mixtures of two or more such compositions, reference to "an agent" includes mixtures of two or more such agents, reference to "the component" includes mixtures of two or more such components, and the like.

"Optional" or "optionally" means that the subsequently described event or circumstance can or cannot occur, and that the description includes instances where the event or circumstance occurs and instances where it does not.

Ranges can be expressed herein as from "about" one particular value, and/or to "about" another particular value. By "about" is meant within 5% of the value, e.g., within 4, 3, 2, or 1% of the value. When such a range is expressed, another aspect includes from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint.

Values can be expressed herein as an "average" value. "Average" generally refers to the statistical mean value.

By "substantially" is meant within 5%, e.g., within 4%, 3%, 2%, or 1%.

"Exemplary" means "an example of" and is not intended to convey an indication of a preferred or ideal embodiment. "Such as" is not used in a restrictive sense, but for explanatory purposes.

It is understood that throughout this specification the identifiers "first" and "second" are used solely to aid in distinguishing the various components and steps of the disclosed subject matter. The identifiers "first" and "second" are not intended to imply any particular order, amount, preference, or importance to the components or steps modified by these terms.

References in the specification and concluding claims to parts by weight of a particular element or component in a composition denotes the weight relationship between the element or component and any other elements or components in the composition or article for which a part by weight is expressed. Thus, in a compound containing 2 parts by weight of component X and 5 parts by weight component Y, X and Y are present at a weight ratio of 2:5, and are present in such ratio regardless of whether additional components are contained in the compound.

A weight percent (wt. %) of a component, unless specifically stated to the contrary, is based on the total weight of the formulation or composition in which the component is included.

The term "or combinations thereof" as used herein refers to all permutations and combinations of the listed items preceding the term. For example, "A, B, C, or combinations thereof" is intended to include at least one of: A, B, C, AB, AC, BC, or ABC, and if order is important in a particular context, also BA, CA, CB, CBA, BCA, ACB, BAC, or CAB. Continuing with this example, expressly included are combinations that contain repeats of one or more item or term, such as BB, AAA, AB, BBC, AAABCCCC, CBBAAA, CABABB, and so forth. The skilled artisan will understand that typically there is no limit on the number of items or terms in any combination, unless otherwise apparent from the context.

Photonic Materials and Methods of Making and Use Thereof

Disclosed herein are photonic materials. The photonic materials comprise a first layer, a second layer, and a third layer, wherein the second layer is disposed between and in contact with the first layer and the third layer, such that the second layer is sandwiched between the first layer and the third layer.

The first layer comprises $In_yGa_{1-y}N$, wherein y can be 0 or more (e.g., 0.01 or more, 0.02 or more, 0.03 or more, 0.04 or more, 0.05 or more, 0.06 or more, 0.07 or more, 0.08 or more, 0.09 or more, 0.10 or more, 0.11 or more, 0.12 or more, 0.13 or more, 0.14 or more, 0.15 or more, 0.16 or more, 0.17 or more, 0.18 or more, 0.19 or more, 0.20 or more, 0.21 or more, 0.22 or more, 0.23 or more, 0.24 or more, 0.25 or more, 0.26 or more, 0.27 or more, 0.28 or more, 0.29 or more, 0.30 or more, 0.31 or more, 0.32 or more, 0.33 or more, 0.34 or more, 0.35 or more, 0.4 or more, 0.45 or more, 0.5 or more, 0.6 or more, 0.65 or more, 0.7 or more, or 0.75 or more). In some examples, y can be 0.8 or less (e.g., 0.75 or less, 0.7 or less, 0.65 or less, 0.6 or less, 0.5 or less, 0.45 or less, 0.4 or less, 0.35 or less, 0.34 or less, 0.33 or less, 0.32 or less, 0.31 or less, 0.30 or less, 0.29 or less, 0.28 or less, 0.27 or less, 0.26 or less, 0.25 or less, 0.24 or less, 0.23 or less, 0.22 or less, 0.21 or less, 0.20 or less, 0.19 or less, 0.18 or less, 0.17 or less, 0.16 or less, 0.15 or less, 0.14 or less, 0.13 or less, 0.12 or less, 0.11 or less, 0.10 or less, 0.09 or less, 0.08 or less, 0.07 or less, 0.06 or less, or 0.05 or less). The value of y can range from any of the minimum values described above to any of the maximum values described above. For example, y can be from 0 to 0.8 (e.g., from 0 to 0.4, from 0.4 to 0.8, from 0 to 0.2, from 0.2 to 0.4, from 0.4 to 0.6, from 0.6 to 0.8, from 0 to 0.7, from 0 to 0.6, from 0 to 0.5, from 0 to 0.3, from 0 to 0.1, from 0.1 to 0.8, from 0.2 to 0.8, from 0.3 to 0.8, from 0.5 to 0.8, from 0.6 to 0.8, from 0.7 to 0.8, from 0.1 to 0.7, from 0.1 to 0.6, from 0.1 to 0.5, from 0.1 to 0.4, or from 0.1 to 0.3). In some examples, y is 0.2. In some examples, the first layer consists of $In_yGa_{1-y}N$.

The first layer can have a first average thickness of 0.1 nanometers (nm) or more (e.g., 0.2 nm or more, 0.3 nm or more, 0.4 nm or more, 0.5 nm or more, 0.6 nm or more, 0.7 nm or more, 0.8 nm or more, 0.9 nm or more, 1.0 nm or more, 1.1 nm or more, 1.2 nm or more, 1.3 nm or more, 1.4 nm or more, 1.5 nm or more, 1.6 nm or more, 1.7 nm or more, 1.8 nm or more, 1.9 nm or more, 2.0 nm or more, 2.1 nm or more, 2.2 nm or more, 2.3 nm or more, 2.4 nm or more, 2.5 nm or more, 3 nm or more, 3.5 nm or more, or 4 nm or more). In some examples, the first layer can have a first average thickness of 5 nm or less (e.g., 4.5 nm or less, 4 nm or less, 3.5 nm or less, 3 nm or less, 2.5 nm or less, 2.4 nm or less, 2.3 nm or less, 2.2 nm or less, 2.1 nm or less, 2.0 nm or less, 1.9 nm or less, 1.8 nm or less, 1.7 nm or less, 1.6 nm or less, 1.5 nm or less, 1.4 nm or less, 1.3 nm or less, 1.2 nm or less, 1.1 nm or less, 1.0 nm or less, 0.9 nm or less, 0.8 nm or less, 0.7 nm or less, 0.6 nm or less, 0.5 nm or less, 0.4 nm or less, 0.3 nm or less, or 0.2 nm or less). The first average thickness can range from any of the minimum values described above to any of the maximum values described above. For example, the first layer can have a first average thickness of from 0.1 nm to 5 nm (e.g., from 0.1 nm to 2.5 nm, from 2.5 nm to 5 nm, from 0.1 nm to 1 nm, from 1 nm to 2 nm, from 2 nm to 3 nm, from 3 nm to 4 nm, from 4 nm to 5 nm, from 0.1 nm to 4 nm, from 0.1 nm to 3 nm, from 0.1 nm to 2 nm, from 0.5 nm to 5 nm, from 1 nm to 5 nm, from 2 nm to 5 nm, from 3 nm to 5 nm, from 0.5 nm to 4.5 nm, from 1 nm to 4 nm, or from 1 to 3 nm). The average thickness can be measured using methods known in the art, such as evaluation by electron microscopy (e.g., cross-sectional TEM imaging).

The second layer comprises $(Zn_aSn_bGe_c)_xGa_dN_2$, wherein: x is from greater than 0 to 1; a, b, c, and d are each independently from 0 to 1; with the proviso that at least one of a, b, or c is greater than 0.

For example, x can be greater than 0 (e.g., 0.01 or more, 0.02 or more, 0.03 or more, 0.04 or more, 0.05 or more, 0.06 or more, 0.07 or more, 0.08 or more, 0.09 or more, 0.10 or more, 0.11 or more, 0.12 or more, 0.13 or more, 0.14 or more, 0.15 or more, 0.16 or more, 0.17 or more, 0.18 or more, 0.19 or more, 0.20 or more, 0.21 or more, 0.22 or more, 0.23 or more, 0.24 or more, 0.25 or more, 0.26 or more, 0.27 or more, 0.28 or more, 0.29 or more, 0.30 or more, 0.31 or more, 0.32 or more, 0.33 or more, 0.34 or more, 0.35 or more, 0.4 or more, 0.45 or more, 0.5 or more, 0.6 or more, 0.65 or more, 0.7 or more, 0.75 or more, 0.8 or more, 0.85 or more, 0.9 or more, or 0.95 or more). In some examples, x can be 1 or less (e.g., 0.95 or less, 0.9 or less, 0.85 or less, 0.8 or less, 0.75 or less, 0.7 or less, 0.65 or less, 0.6 or less, 0.5 or less, 0.45 or less, 0.4 or less, 0.35 or less, 0.34 or less, 0.33 or less, 0.32 or less, 0.31 or less, 0.30 or less, 0.29 or less, 0.28 or less, 0.27 or less, 0.26 or less, 0.25 or less, 0.24 or less, 0.23 or less, 0.22 or less, 0.21 or less, 0.20 or less, 0.19 or less, 0.18 or less, 0.17 or less, 0.16 or less, 0.15 or less, 0.14 or less, 0.13 or less, 0.12 or less, 0.11 or less, 0.10 or less, 0.09 or less, 0.08 or less, 0.07 or less, 0.06 or less, or 0.05 or less). The value of x can range from any of the minimum values described above to any of the maximum values described above. For example, x can be from greater than 0 to 1 (e.g., from greater than 0 to 0.5, from 0.5 to 1, from greater than 0 to 0.2, from 0.2 to 0.4, from 0.4 to 0.6, from 0.6 to 0.8, from 0.8 to 1, from greater than 0 to 0.9, from greater than 0 to 0.8, from greater than 0 to 0.7, from greater than 0 to 0.6, from greater than 0 to 0.4, from greater than 0 to 0.3, from greater than 0 to 0.1, from 0.1 to 1, from 0.2 to 1, from 0.3 to 1, from 0.5 to 1, from 0.6 to 1, from 0.7 to 1, from 0.9 to 1, from 0.1 to 0.9, from 0.1 to 0.8, from 0.1 to 0.7, from 0.1 to 0.6, from 0.1 to 0.5, from 0.1 to 0.4, or from 0.1 to 0.3). In some examples, x is 0.5. In some examples, x is 1.

In some examples, a is 0 or more (e.g., 0.01 or more, 0.02 or more, 0.03 or more, 0.04 or more, 0.05 or more, 0.06 or more, 0.07 or more, 0.08 or more, 0.09 or more, 0.10 or more, 0.11 or more, 0.12 or more, 0.13 or more, 0.14 or more, 0.15 or more, 0.16 or more, 0.17 or more, 0.18 or more, 0.19 or more, 0.20 or more, 0.21 or more, 0.22 or more, 0.23 or more, 0.24 or more, 0.25 or more, 0.26 or more, 0.27 or more, 0.28 or more, 0.29 or more, 0.30 or more, 0.31 or more, 0.32 or more, 0.33 or more, 0.34 or more, 0.35 or more, 0.4 or more, 0.45 or more, 0.5 or more, 0.6 or more, 0.65 or more, 0.7 or more, 0.75 or more, 0.8 or more, 0.85 or more, 0.9 or more, or 0.95 or more). In some examples, a can be 1 or less (e.g., 0.95 or less, 0.9 or less, 0.85 or less, 0.8 or less, 0.75 or less, 0.7 or less, 0.65 or less, 0.6 or less, 0.5 or less, 0.45 or less, 0.4 or less, 0.35 or less, 0.34 or less, 0.33 or less, 0.32 or less, 0.31 or less, 0.30 or less, 0.29 or less, 0.28 or less, 0.27 or less, 0.26 or less, 0.25 or less, 0.24 or less, 0.23 or less, 0.22 or less, 0.21 or less, 0.20 or less, 0.19 or less, 0.18 or less, 0.17 or less, 0.16 or less, 0.15 or less, 0.14 or less, 0.13 or less, 0.12 or less, 0.11 or less, 0.10 or less, 0.09 or less, 0.08 or less, 0.07 or less, 0.06 or less, or 0.05 or less). The value of a can range from any of the minimum values described above to any of the maximum values described above. For example, a can be from 0 to 1 (e.g., from 0 to 0.5, from 0.5 to 1, from 0 to 0.2, from 0.2 to 0.4, from 0.4 to 0.6, from 0.6 to 0.8, from 0.8 to 1, from 0 to 0.9, from 0 to 0.8, from 0 to 0.7, from 0 to 0.6, from 0 to 0.4, from 0 to 0.3, from 0 to 0.1, from 0.1 to 1, from 0.2 to 1, from 0.3 to 1, from 0.5 to 1, from 0.6 to 1, from 0.7 to 1, from 0.9 to 1, from 0.1 to 0.9, from 0.1 to 0.8, from 0.1 to 0.7, from 0.1 to 0.6, from 0.1 to 0.5, from 0.1 to 0.4, or from 0.1 to 0.3). In some examples, a is 0. In some examples, a is 1.

In some examples, b is 0 or more (e.g., 0.01 or more, 0.02 or more, 0.03 or more, 0.04 or more, 0.05 or more, 0.06 or more, 0.07 or more, 0.08 or more, 0.09 or more, 0.10 or more, 0.11 or more, 0.12 or more, 0.13 or more, 0.14 or more, 0.15 or more, 0.16 or more, 0.17 or more, 0.18 or more, 0.19 or more, 0.20 or more, 0.21 or more, 0.22 or more, 0.23 or more, 0.24 or more, 0.25 or more, 0.26 or more, 0.27 or more, 0.28 or more, 0.29 or more, 0.30 or more, 0.31 or more, 0.32 or more, 0.33 or more, 0.34 or more, 0.35 or more, 0.4 or more, 0.45 or more, 0.5 or more, 0.6 or more, 0.65 or more, 0.7 or more, 0.75 or more, 0.8 or more, 0.85 or more, 0.9 or more, or 0.95 or more). In some examples, b can be 1 or less (e.g., 0.95 or less, 0.9 or less, 0.85 or less, 0.8 or less, 0.75 or less, 0.7 or less, 0.65 or less, 0.6 or less, 0.5 or less, 0.45 or less, 0.4 or less, 0.35 or less, 0.34 or less, 0.33 or less, 0.32 or less, 0.31 or less, 0.30 or less, 0.29 or less, 0.28 or less, 0.27 or less, 0.26 or less, 0.25 or less, 0.24 or less, 0.23 or less, 0.22 or less, 0.21 or less, 0.20 or less, 0.19 or less, 0.18 or less, 0.17 or less, 0.16 or less, 0.15 or less, 0.14 or less, 0.13 or less, 0.12 or less, 0.11 or less, 0.10 or less, 0.09 or less, 0.08 or less, 0.07 or less, 0.06 or less, or 0.05 or less). The value of b can range from any of the minimum values described above to any of the maximum values described above. For example, b can be from 0 to 1 (e.g., from 0 to 0.5, from 0.5 to 1, from 0 to 0.2, from 0.2 to 0.4, from 0.4 to 0.6, from 0.6 to 0.8, from 0.8 to 1, from 0 to 0.9, from 0 to 0.8, from 0 to 0.7, from 0 to 0.6, from 0 to 0.4, from 0 to 0.3, from 0 to 0.1, from 0.1 to 1, from 0.2 to 1, from 0.3 to 1, from 0.5 to 1, from 0.6 to 1, from 0.7 to 1, from 0.9 to 1, from 0.1 to 0.9, from 0.1 to 0.8, from 0.1 to 0.7, from 0.1 to 0.6, from 0.1 to 0.5, from 0.1 to 0.4, or from 0.1 to 0.3). In some examples, b is 0. In some examples, b is 1.

In some examples, c is 0 or more (e.g., 0.01 or more, 0.02 or more, 0.03 or more, 0.04 or more, 0.05 or more, 0.06 or more, 0.07 or more, 0.08 or more, 0.09 or more, 0.10 or more, 0.11 or more, 0.12 or more, 0.13 or more, 0.14 or more, 0.15 or more, 0.16 or more, 0.17 or more, 0.18 or more, 0.19 or more, 0.20 or more, 0.21 or more, 0.22 or more, 0.23 or more, 0.24 or more, 0.25 or more, 0.26 or more, 0.27 or more, 0.28 or more, 0.29 or more, 0.30 or more, 0.31 or more, 0.32 or more, 0.33 or more, 0.34 or more, 0.35 or more, 0.4 or more, 0.45 or more, 0.5 or more, 0.6 or more, 0.65 or more, 0.7 or more, 0.75 or more, 0.8 or more, 0.85 or more, 0.9 or more, or 0.95 or more). In some examples, c can be 1 or less (e.g., 0.95 or less, 0.9 or less, 0.85 or less, 0.8 or less, 0.75 or less, 0.7 or less, 0.65 or less, 0.6 or less, 0.5 or less, 0.45 or less, 0.4 or less, 0.35 or less, 0.34 or less, 0.33 or less, 0.32 or less, 0.31 or less, 0.30 or less, 0.29 or less, 0.28 or less, 0.27 or less, 0.26 or less, 0.25 or less, 0.24 or less, 0.23 or less, 0.22 or less, 0.21 or less, 0.20 or less, 0.19 or less, 0.18 or less, 0.17 or less, 0.16 or less, 0.15 or less, 0.14 or less, 0.13 or less, 0.12 or less, 0.11 or less, 0.10 or less, 0.09 or less, 0.08 or less, 0.07 or less, 0.06 or less, or 0.05 or less). The value of c can range from any of the minimum values described above to any of the maximum values described above. For example, c can be from 0 to 1 (e.g., from 0 to 0.5, from 0.5 to 1, from 0 to 0.2, from 0.2 to 0.4, from 0.4 to 0.6, from 0.6 to 0.8, from 0.8 to 1, from 0 to 0.9, from 0 to 0.8, from 0 to 0.7, from 0 to 0.6, from 0 to 0.4, from 0 to 0.3, from 0 to 0.1, from 0.1 to 1, from 0.2 to 1, from 0.3 to 1, from 0.5 to 1, from 0.6 to 1, from 0.7 to 1, from 0.9 to 1, from 0.1 to 0.9, from 0.1 to 0.8, from 0.1 to 0.7, from 0.1 to 0.6, from 0.1 to 0.5, from 0.1 to 0.4, or from 0.1 to 0.3). In some examples, c is 0. In some examples, c is 1.

In some examples, d is 0 or more (e.g., 0.01 or more, 0.02 or more, 0.03 or more, 0.04 or more, 0.05 or more, 0.06 or more, 0.07 or more, 0.08 or more, 0.09 or more, 0.10 or more, 0.11 or more, 0.12 or more, 0.13 or more, 0.14 or more, 0.15 or more, 0.16 or more, 0.17 or more, 0.18 or more, 0.19 or more, 0.20 or more, 0.21 or more, 0.22 or more, 0.23 or more, 0.24 or more, 0.25 or more, 0.26 or more, 0.27 or more, 0.28 or more, 0.29 or more, 0.30 or more, 0.31 or more, 0.32 or more, 0.33 or more, 0.34 or more, 0.35 or more, 0.4 or more, 0.45 or more, 0.5 or more, 0.6 or more, 0.65 or more, 0.7 or more, 0.75 or more, 0.8 or more, 0.85 or more, 0.9 or more, or 0.95 or more). In some examples, d can be 1 or less (e.g., 0.95 or less, 0.9 or less, 0.85 or less, 0.8 or less, 0.75 or less, 0.7 or less, 0.65 or less, 0.6 or less, 0.5 or less, 0.45 or less, 0.4 or less, 0.35 or less, 0.34 or less, 0.33 or less, 0.32 or less, 0.31 or less, 0.30 or less, 0.29 or less, 0.28 or less, 0.27 or less, 0.26 or less, 0.25 or less, 0.24 or less, 0.23 or less, 0.22 or less, 0.21 or less, 0.20 or less, 0.19 or less, 0.18 or less, 0.17 or less, 0.16 or less, 0.15 or less, 0.14 or less, 0.13 or less, 0.12 or less, 0.11 or less, 0.10 or less, 0.09 or less, 0.08 or less, 0.07 or less, 0.06 or less, or 0.05 or less). The value of d can range from any of the minimum values described above to any of the maximum values described above. For example, d can be from 0 to 1 (e.g., from 0 to 0.5, from 0.5 to 1, from 0 to 0.2, from 0.2 to 0.4, from 0.4 to 0.6, from 0.6 to 0.8, from 0.8 to 1, from 0 to 0.9, from 0 to 0.8, from 0 to 0.7, from 0 to 0.6, from 0 to 0.4, from 0 to 0.3, from 0 to 0.1, from 0.1 to 1, from 0.2 to 1, from 0.3 to 1, from 0.5 to 1, from 0.6 to 1, from 0.7 to 1, from 0.9 to 1, from 0.1 to 0.9, from 0.1 to 0.8, from 0.1 to 0.7, from 0.1 to 0.6, from 0.1 to 0.5, from 0.1 to 0.4, or from 0.1 to 0.3). In some examples, d is 0. In some examples, d is 0.5. In some examples, d is 1.

In some examples, d is equal to 1-x, such that the second layer comprises $(Zn_dSn_bGe_c)_xGa_{1-x}N_2$.

In some examples, the second layer comprises $(ZnSn)_{0.5}Ga_{0.5}N_2$. In some examples, the second layer consists of $(ZnSn)_{0.5}Ga_{0.5}N_2$.

In some examples, the second layer comprises $(ZnSn)_{0.5}GaN_2$. In some examples, the second layer consists of $(ZnSn)_{0.5}GaN_2$.

The second layer can have a second average thickness of 0.1 nanometers (nm) or more (e.g., 0.2 nm or more, 0.3 nm or more, 0.4 nm or more, 0.5 nm or more, 0.6 nm or more, 0.7 nm or more, 0.8 nm or more, 0.9 nm or more, 1.0 nm or more, 1.1 nm or more, 1.2 nm or more, 1.3 nm or more, 1.4 nm or more, 1.5 nm or more, 1.6 nm or more, 1.7 nm or more, 1.8 nm or more, 1.9 nm or more, 2.0 nm or more, 2.1 nm or more, 2.2 nm or more, 2.3 nm or more, 2.4 nm or more, 2.5 nm or more, 3 nm or more, 3.5 nm or more, or 4 nm or more). In some examples, the second layer can have a second average thickness of 5 nm or less (e.g., 4.5 nm or less, 4 nm or less, 3.5 nm or less, 3 nm or less, 2.5 nm or less, 2.4 nm or less, 2.3 nm or less, 2.2 nm or less, 2.1 nm or less, 2.0 nm or less, 1.9 nm or less, 1.8 nm or less, 1.7 nm or less, 1.6 nm or less, 1.5 nm or less, 1.4 nm or less, 1.3 nm or less, 1.2 nm or less, 1.1 nm or less, 1.0 nm or less, 0.9 nm or less, 0.8 nm or less, 0.7 nm or less, 0.6 nm or less, 0.5 nm or less, 0.4 nm or less, 0.3 nm or less, or 0.2 nm or less). The second average thickness can range from any of the minimum values described above to any of the maximum values described above. For example, the second layer can have a second average thickness of from 0.1 nm to 5 nm (e.g., from 0.1 nm to 2.5 nm, from 2.5 nm to 5 nm, from 0.1 nm to 1 nm, from 1 nm to 2 nm, from 2 nm to 3 nm, from 3 nm to 4 nm, from 4 nm to 5 nm, from 0.1 nm to 4 nm, from 0.1 nm to 3 nm, from 0.1 nm to 2 nm, from 0.5 nm to 5 nm, from 1 nm to 5 nm, from 2 nm to 5 nm, from 3 nm to 5 nm, from 0.2 nm to 4.5 nm, from 0.3 nm to 4 nm, or from 0.5 nm to 0.7 nm). The average thickness can be measured using methods known in the art, such as evaluation by electron microscopy (e.g., cross-sectional TEM imaging).

The third layer comprises $In_zGa_{1-z}N$, wherein z can be 0 or more (e.g., 0.01 or more, 0.02 or more, 0.03 or more, 0.04 or more, 0.05 or more, 0.06 or more, 0.07 or more, 0.08 or more, 0.09 or more, 0.10 or more, 0.11 or more, 0.12 or more, 0.13 or more, 0.14 or more, 0.15 or more, 0.16 or more, 0.17 or more, 0.18 or more, 0.19 or more, 0.20 or more, 0.21 or more, 0.22 or more, 0.23 or more, 0.24 or more, 0.25 or more, 0.26 or more, 0.27 or more, 0.28 or more, 0.29 or more, 0.30 or more, 0.31 or more, 0.32 or more, 0.33 or more, 0.34 or more, 0.35 or more, 0.4 or more, 0.45 or more, 0.5 or more, 0.6 or more, 0.65 or more, 0.7 or more, or 0.75 or more). In some examples, z can be 0.8 or less (e.g., 0.75 or less, 0.7 or less, 0.65 or less, 0.6 or less, 0.5 or less, 0.45 or less, 0.4 or less, 0.35 or less, 0.34 or less, 0.33 or less, 0.32 or less, 0.31 or less, 0.30 or less, 0.29 or less, 0.28 or less, 0.27 or less, 0.26 or less, 0.25 or less, 0.24 or less, 0.23 or less, 0.22 or less, 0.21 or less, 0.20 or less, 0.19 or less, 0.18 or less, 0.17 or less, 0.16 or less, 0.15 or less, 0.14 or less, 0.13 or less, 0.12 or less, 0.11 or less, 0.10 or less, 0.09 or less, 0.08 or less, 0.07 or less, 0.06 or less, or 0.05 or less). The value of z can range from any of the minimum values described above to any of the maximum values described above. For example, z can be from 0 to 0.8 (e.g., from 0 to 0.4, from 0.4 to 0.8, from 0 to 0.2, from 0.2 to 0.4, from 0.4 to 0.6, from 0.6 to 0.8, from 0 to 0.7, from 0 to 0.6, from 0 to 0.5, from 0 to 0.3, from 0 to 0.1, from 0.1 to 0.8, from 0.2 to 0.8, from 0.3 to 0.8, from 0.5 to 0.8, from 0.6 to 0.8, from 0.7 to 0.8, from 0.1 to 0.7, from 0.1 to 0.6, from 0.1 to 0.5, from 0.1 to 0.4, or from 0.1 to 0.3). In some examples, z is 0.2. In some examples, the third layer consists of $In_zGa_{1-z}N$.

The third layer can have a third average thickness of 0.1 nanometers (nm) or more (e.g., 0.2 nm or more, 0.3 nm or more, 0.4 nm or more, 0.5 nm or more, 0.6 nm or more, 0.7 nm or more, 0.8 nm or more, 0.9 nm or more, 1.0 nm or more, 1.1 nm or more, 1.2 nm or more, 1.3 nm or more, 1.4 nm or more, 1.5 nm or more, 1.6 nm or more, 1.7 nm or more, 1.8 nm or more, 1.9 nm or more, 2.0 nm or more, 2.1 nm or more, 2.2 nm or more, 2.3 nm or more, 2.4 nm or more, 2.5 nm or more, 3 nm or more, 3.5 nm or more, or 4 nm or more). In some examples, the third layer can have a third average thickness of 5 nm or less (e.g., 4.5 nm or less, 4 nm or less, 3.5 nm or less, 3 nm or less, 2.5 nm or less, 2.4 nm or less, 2.3 nm or less, 2.2 nm or less, 2.1 nm or less, 2.0 nm or less, 1.9 nm or less, 1.8 nm or less, 1.7 nm or less, 1.6 nm or less, 1.5 nm or less, 1.4 nm or less, 1.3 nm or less, 1.2 nm or less, 1.1 nm or less, 1.0 nm or less, 0.9 nm or less, 0.8 nm or less, 0.7 nm or less, 0.6 nm or less, 0.5 nm or less, 0.4 nm or less, 0.3 nm or less, or 0.2 nm or less). The third average thickness can range from any of the minimum values described above to any of the maximum values described above. For example, the third layer can have a first average thickness of from 0.1 nm to 5 nm (e.g., from 0.1 nm to 2.5 nm, from 2.5 nm to 5 nm, from 0.1 nm to 1 nm, from 1 nm to 2 nm, from 2 nm to 3 nm, from 3 nm to 4 nm, from 4 nm to 5 nm, from 0.1 nm to 4 nm, from 0.1 nm to 3 nm, from 0.1 nm to 2 nm, from 0.5 nm to 5 nm, from 1 nm to 5 nm, from 2 nm to 5 nm, from 3 nm to 5 nm, from 0.5 nm to 4.5 nm, from 1 nm to 4 nm, or from 1 to 3 nm). The average thickness can be measured using methods known in the art, such as evaluation by electron microscopy (e.g., cross-sectional TEM imaging).

The photonic materials can, for example, have an average composite thickness wherein the average composite thickness is the sum of the first average thickness, the second average thickness, and the third average thickness. The average composite thickness can, for example, be 0.5 nm or more (e.g., 0.6 nm or more, 0.7 nm or more, 0.8 nm or more, 0.9 nm or more, 1.0 nm or more, 1.1 nm or more, 1.2 nm or more, 1.3 nm or more, 1.4 nm or more, 1.5 nm or more, 1.6 nm or more, 1.7 nm or more, 1.8 nm or more, 1.9 nm or more, 2.0 nm or more, 2.1 nm or more, 2.2 nm or more, 2.3 nm or more, 2.4 nm or more, 2.5 nm or more, 3 nm or more, 3.5 nm or more, 4 nm or more, 4.5 nm or more, 5 nm or more, 5.5 nm or more, 6 nm or more, 6.5 nm or more, 7 nm or more, 7.5 nm or more, 8 nm or more, 8.5 nm or more, 9 nm or more, or 9.5 nm or more). In some examples, the average composite thickness can be 10 nm or less (e.g., 9.5 nm or less, 9 nm or less, 8.5 nm or less, 8 nm or less, 7.5 nm or less, 7 nm or less, 6.5 nm or less, 6 nm or less, 5.5 nm or less, 5 nm or less, 4.5 nm or less, 4 nm or less, 3.5 nm or less, 3 nm or less, 2.5 nm or less, 2.4 nm or less, 2.3 nm or less, 2.2 nm or less, 2.1 nm or less, 2.0 nm or less, 1.9 nm or less, 1.8 nm or less, 1.7 nm or less, 1.6 nm or less, 1.5 nm or less, 1.4 nm or less, 1.3 nm or less, 1.2 nm or less, 1.1 nm or less, 1.0 nm or less, 0.9 nm or less, 0.8 nm or less, 0.7 nm or less, 0.6 nm or less, 0.5 nm or less, 0.4 nm or less, 0.3 nm or less, or 0.2 nm or less). The average composite thickness can range from any of the minimum values described above to any of the maximum values described above. For example, the photonic material can have an average composite thickness of from 0.5 nm to 10 nm (e.g., from 0.5 nm to 5 nm, from 5 nm to 10 nm, from 0.5 nm to 2 nm, from 2 nm to 4 nm, from 4 nm to 6 nm, from 6 nm to 8 nm, from 8 nm to 10 nm, from 0.5 nm to 9 nm, from 0.5 nm to 8 nm, from 0.5 nm to 7 nm, from 0.5 nm to 6 nm, from 0.5 nm to 4 nm, from 0.5 nm to 3 nm, from 1 nm to 10 nm, from 2 nm to 10 nm, from 3 nm to 10 nm, from 4 nm to 10 nm, from 6 nm to 10 nm, from 7 nm to 10 nm, from 9 nm to 10 nm, from 1 nm to 9 nm, from 1 nm to 7 nm, from 1 nm to 5 nm, from 2.5 nm to 5 nm, or from 4 nm to 5 nm). The average thickness can be measured using methods known in the art, such as evaluation by electron microscopy (e.g., cross-sectional TEM imaging).

In some examples, the photonic materials can be sandwiched between two barrier layers to form a quantum well.

In some examples, the photonic materials can further comprise a fourth layer, wherein the fourth layer can be disposed on the third layer, such that the third layer is sandwiched between the second layer and the fourth layer. The fourth layer can comprise $Al_wGa_{1-w}N$ where w is 0 or more (e.g., 0.01 or more, 0.02 or more, 0.03 or more, 0.04 or more, 0.05 or more, 0.06 or more, 0.07 or more, 0.08 or more, 0.09 or more, 0.10 or more, 0.11 or more, 0.12 or more, 0.13 or more, 0.14 or more, 0.15 or more, 0.16 or more, 0.17 or more, 0.18 or more, 0.19 or more, 0.20 or more, 0.21 or more, 0.22 or more, 0.23 or more, 0.24 or more, 0.25 or more, 0.26 or more, 0.27 or more, 0.28 or more, 0.29 or more, 0.30 or more, 0.31 or more, 0.32 or more, 0.33 or more, 0.34 or more, 0.35 or more, 0.4 or more, 0.45 or more, 0.5 or more, 0.6 or more, 0.65 or more, 0.7 or more, 0.75 or more, 0.8 or more, 0.85 or more, 0.9 or more, or 0.95 or more). In some examples, w can be 1 or less (e.g., 0.95 or less, 0.9 or less, 0.85 or less, 0.8 or less, 0.75 or less, 0.7 or less, 0.65 or less, 0.6 or less, 0.5 or less, 0.45 or less, 0.4 or less, 0.35 or less, 0.34 or less, 0.33 or less, 0.32 or less, 0.31 or less, 0.30 or less, 0.29 or less, 0.28 or less, 0.27 or less, 0.26 or less, 0.25 or less, 0.24 or less, 0.23 or less, 0.22 or less, 0.21 or less, 0.20 or less, 0.19 or less, 0.18 or less, 0.17 or less, 0.16 or less, 0.15 or less, 0.14 or less, 0.13 or less, 0.12 or less, 0.11 or less, 0.10 or less, 0.09 or less, 0.08 or less, 0.07 or less, 0.06 or less, or 0.05 or less). The value of w can range from any of the minimum values described above to any of the maximum values described above. For example, w can be from 0 to 1 (e.g., from 0 to 0.5, from 0.5 to 1, from 0 to 0.2, from 0.2 to 0.4, from 0.4 to 0.6, from 0.6 to 0.8, from 0.8 to 1, from 0 to 0.9, from 0 to 0.8, from 0 to 0.7, from 0 to 0.6, from 0 to 0.4, from 0 to 0.3, from 0 to 0.1, from 0.1 to 1, from 0.2 to 1, from 0.3 to 1, from 0.5 to 1, from 0.6 to 1, from 0.7 to 1, from 0.9 to 1, from 0.1 to 0.9, from 0.1 to 0.8, from 0.1 to 0.7, from 0.1 to 0.6, from 0.1 to 0.5, from 0.1 to 0.4, or from 0.1 to 0.3). In some examples, w is 0.2 In some examples, the fourth layer can consist of $Al_wGa_{1-w}N$.

The fourth layer can have a fourth average thickness of 0.5 nm or more (e.g., 0.6 nm or more, 0.7 nm or more, 0.8 nm or more, 0.9 nm or more, 1.0 nm or more, 1.1 nm or more, 1.2 nm or more, 1.3 nm or more, 1.4 nm or more, 1.5 nm or more, 1.6 nm or more, 1.7 nm or more, 1.8 nm or more, 1.9 nm or more, 2.0 nm or more, 2.1 nm or more, 2.2 nm or more, 2.3 nm or more, 2.4 nm or more, 2.5 nm or more, 3 nm or more, 3.5 nm or more, or 4 nm or more). In some examples, the fourth layer can have a fourth average thickness of 5 nm or less (e.g., 4.5 nm or less, 4 nm or less, 3.5 nm or less, 3 nm or less, 2.5 nm or less, 2.4 nm or less, 2.3 nm or less, 2.2 nm or less, 2.1 nm or less, 2.0 nm or less, 1.9 nm or less, 1.8 nm or less, 1.7 nm or less, 1.6 nm or less, 1.5 nm or less, 1.4 nm or less, 1.3 nm or less, 1.2 nm or less, 1.1 nm or less, or 1.0 nm or less). The fourth average thickness can range from any of the minimum values described above to any of the maximum values described above. For example, the fourth layer can have a fourth average thickness of from 0.5 nm to 5 nm (e.g., from 0.5 nm to 2.5 nm, from 2.5 nm to 5 nm, from 0.5 nm to 1 nm, from 1 nm to 2 nm, from 2 nm to 3 nm, from 3 nm to 4 nm, from 4 nm to 5 nm, from 0.5 nm to 4 nm, from 0.5 nm to 3 nm, from 0.5 nm to 2 nm, from 1 nm to 5 nm, from 2 nm to 5 nm, from 3 nm to 5 nm, from 4 nm to 5 nm, from 1 nm to 4 nm, from 1 nm to 3 nm, from 1 nm to 2 nm, or from 1.4 nm to 1.6 nm). The average thickness can be measured using methods known in the art, such as evaluation by electron microscopy (e.g., cross-sectional TEM imaging).

In some examples, the photonic materials can further comprise a fifth layer, wherein the fifth layer can be disposed on the fourth layer, such that the fourth layer is sandwiched between the fifth layer and the third layer. In some examples, the fifth layer comprises GaN. In some examples, the fifth layer consists of GaN.

In some examples, the fifth layer has a fifth average thickness of 1 nm or more (e.g., 1.5 nm or more, 2 nm or more, 2.5 nm or more, 3 nm or more, 3.5 nm or more, 4 nm or more, 4.5 nm or more, 5 nm or more, 6 nm or more, 7 nm or more, 8 nm or more, 9 nm or more, 10 nm or more, 11 nm or more, 12 nm or more, 13 nm or more, or 14 nm or more). In some examples, the fifth layer has a fifth average thickness of 15 nm or less (e.g., 14 nm or less, 13 nm or less, 12 nm or less, 11 nm or less, 10 nm or less, 9 nm or less, 8 nm or less, 7 nm or less, 6 nm or less, 5 nm or less, 4.5 nm or less, 4 nm or less, 3.5 nm or less, 3 nm or less, 2.5 nm or less, 2 nm or less, or 1.5 nm or less). The fifth average thickness can range from any of the minimum values described above to any of the maximum values described above. For example, the fifth layer can have a fifth average thickness of from 1 nm to 15 nm (e.g., from 1 nm to 7 nm, from 7 nm to 15 nm, from 1 nm to 5 nm, from 5 nm to 10 nm, from 10 nm to 15 nm, from 1 nm to 14 nm, from 1 nm to 13 nm, from 1 nm to 12 nm, from 1 nm to 11 nm, from 1 nm to 10 nm, from 1 nm to 9 nm, from 1 nm to 8 nm, from 1 nm to 6 nm, from 1 nm to 4 nm, from 1 nm to 3 nm, from 1 nm to 2 nm, from 2 nm to 15 nm, from 3 nm to 15 nm, from 4 nm to 15 nm, from 5 nm to 15 nm, from 6 nm to 15 nm, from 8 nm to 15 nm, from 9 nm to 15 nm, from 11 nm to 15 nm, from 12 nm to 15 nm, from 13 nm to 15 nm, from 14 nm to 15 nm, from 2 nm to 14 nm, or from 3 nm to 13 nm). The average thickness can be measured using methods known in the art, such as evaluation by electron microscopy (e.g., cross-sectional TEM imaging).

In some examples, the photonic materials can further comprise a sixth layer, wherein the sixth layer can be disposed on the first layer, such that the first layer is sandwiched between the sixth layer and the second layer. In some examples, the sixth layer comprises GaN. In some examples, the sixth layer consists of GaN.

In some examples, the sixth layer has a sixth average thickness of 1 nm or more (e.g., 1.5 nm or more, 2 nm or more, 2.5 nm or more, 3 nm or more, 3.5 nm or more, 4 nm or more, 4.5 nm or more, 5 nm or more, 6 nm or more, 7 nm or more, 8 nm or more, 9 nm or more, 10 nm or more, 11 nm or more, 12 nm or more, 13 nm or more, or 14 nm or more). In some examples, the sixth layer has a sixth average thickness of 15 nm or less (e.g., 14 nm or less, 13 nm or less, 12 nm or less, 11 nm or less, 10 nm or less, 9 nm or less, 8 nm or less, 7 nm or less, 6 nm or less, 5 nm or less, 4.5 nm or less, 4 nm or less, 3.5 nm or less, 3 nm or less, 2.5 nm or less, 2 nm or less, or 1.5 nm or less). The sixth average thickness can range from any of the minimum values described above to any of the maximum values described above. For example, the sixth layer can have a sixth average thickness of from 1 nm to 15 nm (e.g., from 1 nm to 7 nm, from 7 nm to 15 nm, from 1 nm to 5 nm, from 5 nm to 10 nm, from 10 nm to 15 nm, from 1 nm to 14 nm, from 1 nm to 13 nm, from 1 nm to 12 nm, from 1 nm to 11 nm, from 1 nm to 10 nm, from 1 nm to 9 nm, from 1 nm to 8 nm, from 1 nm to 6 nm, from 1 nm to 4 nm, from 1 nm to 3 nm, from 1 nm to 2 nm, from 2 nm to 15 nm, from 3 nm to 15 nm, from 4 nm to 15 nm, from 5 nm to 15 nm, from 6 nm to 15 nm, from 8 nm to 15 nm, from 9 nm to 15 nm, from 11 nm to 15 nm, from 12 nm to 15 nm, from 13 nm to 15 nm, from 14 nm to 15 nm, from 2 nm to 14 nm, or from 3 nm to 13 nm). The average thickness can be measured using methods known in the art, such as evaluation by electron microscopy (e.g., cross-sectional TEM imaging).

The photonic materials described herein can have an electron wavefunction with a first confined state and a hole wavefunction with a first confined state, and wherein the overlap of the electron wavefunction and the hole wavefunction in the first confined state in the photonic material is 1% or more (e.g., 2% or more, 3% or more, 4% or more, 5% or more, 10% or more, 15% or more, 20% or more, 25% or more, 30% or more, 35% or more, 40% or more, 45% or more, 50% or more, 51% or more, 52% or more, 53% or more, 54% or more, 55% or more, 56% or more, 57% or more, 58% or more, 59% or more, 60% or more, 61% or more, 62% or more, 63% or more, 64% or more, 65% or more, 66% or more, 67% or more, 68% or more, 69% or more, 70% or more, 75% or more, 80% or more, 85% or more, 90% or more, or 95% or more).

In some examples, the photonic material exhibits a strong hole confinement in the second layer.

In some examples, the photonic material has a spontaneous emission spectrum with a peak wavelength of 500 nm or more (e.g., 510 nm or more, 520 nm or more, 530 nm or more, 540 nm or more, 550 nm or more, 560 nm or more, 570 nm or more, 580 nm or more, 590 nm or more, 600 nm or more, 610 nm or more, 620 nm or more, 630 nm or more, 640 nm or more, 650 nm or more, 660 nm or more, 670 nm or more, 680 nm or more, 690 nm or more, 700 nm or more, 725 nm or more, 750 nm or more, 775 nm or more, 800 nm or more, 825 nm or more, 850 nm or more, 875 nm or more, 900 nm or more, 925 nm or more, 950 nm or more, 975 nm or more, 1000 nm or more, 1050 nm or more, 1100 nm or more, 1150 nm or more, 1200 nm or more, 1250 nm or more, or 1300 nm or more). In some examples, the photonic material can have a spontaneous emission spectrum with a peak wavelength of 1400 nm or less (e.g., 1350 nm or less, 1300 nm or less, 1250 nm or less, 1200 nm or less, 1150 nm or less, 1100 nm or less, 1050 nm or less, 1000 nm or less, 970 nm or less, 950 nm or less, 925 nm or less, 900 nm or less, 875 nm or less, 850 nm or less, 825 nm or less, 800 nm or less, 775 nm or less, 750 nm or less, 725 nm or less, 700 nm or less, 690 nm or less, 680 nm or less, 670 nm or less, 660 nm or less, 650 nm or less, 640 nm or less, 630 nm or less, 620 nm or less, 610 nm or less, 600 nm or less, 590 nm or less, 580 nm or less, 570 nm or less, 560 nm or less, 550 nm or less, 540 nm or less, or 530 nm or less). The peak wavelength of the spontaneous emission spectrum of the photonic material can range from any of the minimum values described above to any of the maximum values described above. For example, the photonic material can have a spontaneous emission spectrum with a peak wavelength of from 500 nm to 1400 nm (e.g., from 500 nm to 950 nm, from 950 nm to 1400 nm, from 500 nm to 800 nm, from 800 nm to 1100 nm, from 1100 nm to 1400 nm, from 500 nm to 1300 nm, from 500 nm to 1200 nm, from 500 nm to 1100 nm, from 500 nm to 1000 nm, from 500 nm to 900 nm, from 500 nm to 700 nm, from 500 nm to 600 nm, from 550 nm to 1400 nm, from 600 nm to 1400 nm, from 700 nm to 1400 nm, from 800 nm to 1400 nm, from 900 nm to 1400 nm, from 1000 nm to 1400 nm, from 1200 nm to 1400 nm, from 1300 nm to 1400 nm, from 500 nm to 700 nm, from 500 nm to 570 nm, from 525 nm to 535 nm, from 570 nm to 590 nm, from 580 nm to 600 nm, from 590 nm to 620 nm, from 595 nm to 605 nm, from 620 nm to 750 nm, from 680 nm to 690 nm, from 750 nm to 1400 nm, from 750 nm to 1000 nm, from 1000 nm to 1400 nm, from 800 nm to 1000 nm, or from 500 nm to 1200 nm).

In some examples, the photonic material can have a carrier concentration of $1 \times 10^{15}$ cm$^{-3}$ or more (e.g., $5 \times 10^{15}$ cm$^{-3}$ or more, $1 \times 10^{16}$ cm$^{-3}$ or more, $5 \times 10^{16}$ cm$^{-3}$ or more, $1 \times 10^{17}$ cm$^{-3}$ or more, $5 \times 10^{17}$ cm$^{-3}$ or more, $1 \times 10^{18}$ cm$^{-3}$ or more, $2 \times 10^{18}$ cm$^{-3}$ or more, $3 \times 10^{18}$ cm$^{-3}$ or more, $4 \times 10^{18}$ cm$^{-3}$ or more, $5 \times 10^{18}$ cm$^{-3}$ or more, $6 \times 10^{18}$ cm$^{-3}$ or more, $7 \times 10^{18}$ cm$^{-3}$ or more, $8 \times 10^{18}$ cm$^{-3}$ or more, $9 \times 10^{18}$ cm$^{-3}$ or more, $1 \times 10^{19}$ cm$^{-3}$ or more, $5 \times 10^{19}$ cm$^{-3}$ or more, $1 \times 10^{20}$ cm$^{-3}$ or more, $5 \times 10^{20}$ cm$^{-3}$ or more, $1 \times 10^{21}$ cm$^{-3}$ or more, $5 \times 10^{21}$ cm$^{-3}$ or more, $1 \times 10^{22}$ cm$^{-3}$ or more, or $5 \times 10^{22}$ cm$^{-3}$ or more). In some examples, the photonic material can have a carrier concentration of $1 \times 10^{23}$ cm$^{-3}$ or less (e.g., $5 \times 10^{22}$ cm$^{-3}$ or less, $1 \times 10^{22}$ cm$^{-3}$ or less, $5 \times 10^{21}$ cm$^{-3}$ or less, $1 \times 10^{21}$ cm$^{-3}$ or less, $5 \times 10^{20}$ cm$^{-3}$ or less, $1 \times 10^{20}$ cm$^{-3}$ or less, $5 \times 10^{19}$ cm$^{-3}$ or less, $1 \times 10^{19}$ cm$^{-3}$ or less, $9 \times 10^{18}$ cm$^{-3}$ or less, $8 \times 10^{18}$ cm$^{-3}$ or less, $7 \times 10^{18}$ cm$^{-3}$ or less, $6 \times 10^{18}$ cm$^{-3}$ or less, $5 \times 10^{18}$ cm$^{-3}$ or less, $4 \times 10^{18}$ cm$^{-3}$ or less, $3 \times 10^{18}$ cm$^{-3}$ or less, $2 \times 10^{18}$ cm$^{-3}$ or less, $1 \times 10^{18}$ cm$^{-3}$ or less, $5 \times 10^{17}$ cm$^{-3}$ or less, $1 \times 10^{17}$ cm$^{-3}$ or less, or $5 \times 10^{16}$ cm$^{-3}$ or less).

The carrier concentration of the photonic material can range from any of the minimum values described above to any of the maximum values described above. For example, the photonic material can have a carrier concentration of from $1 \times 10^{15}$ cm$^{-3}$ to $1 \times 10^{23}$ cm$^{-3}$ (e.g., from $1 \times 10^{15}$ cm$^{-3}$ to $1 \times 10^{19}$ cm$^{-3}$, from $1 \times 10^{19}$ cm$^{-3}$ to $1 \times 10^{23}$ cm$^{-3}$, from $1 \times 10^{15}$ cm$^{-3}$ to $1 \times 10^{17}$ cm$^{-3}$, from $1 \times 10^{17}$ cm$^{-3}$ to $1 \times 10^{19}$ cm$^{-3}$, from $1 \times 10^{19}$ cm$^{-3}$ to $1 \times 10^{21}$ cm$^{-3}$, from $1 \times 10^{21}$ cm$^{-3}$ to $1 \times 10^{23}$ cm$^{-3}$, from $1 \times 10^{15}$ cm$^{-3}$ to $1 \times 10^{22}$ cm$^{-3}$, from $1 \times 10^{15}$ cm$^{-3}$ to $1 \times 10^{21}$ cm$^{-3}$, from $1 \times 10^{15}$ cm$^{-3}$ to $1 \times 10^{20}$ cm$^{-3}$, from $1 \times 10^{15}$ cm$^{-3}$ to $1 \times 10^{19}$ cm$^{-3}$, from $1 \times 10^{15}$ cm$^{-3}$ to $1\times10^{18}$ cm$^{-3}$, from $1\times10^{15}$ cm$^{-3}$ to $1\times10^{17}$ cm$^{-3}$, from $1\times10^{15}$ cm$^{-3}$ to $1\times10^{16}$ cm$^{-3}$, from $1\times10^{16}$ cm$^{-3}$ to $1\times10^{23}$ cm$^{-3}$, from $1\times10^{17}$ cm$^{-3}$ to $1\times10^{23}$ cm$^{-3}$, from $1\times10^{18}$ cm$^{-3}$ to $1\times10^{23}$ cm$^{-3}$, from $1\times10^{19}$ cm$^{-3}$ to $1\times10^{23}$ cm$^{-3}$, from $1\times10^{21}$ cm$^{-3}$ to $1\times10^{23}$ cm$^{-3}$, from $1\times10^{22}$ cm$^{-3}$ to $1\times10^{23}$ cm$^{-3}$, from $1\times10^{16}$ cm$^{-3}$ to $1\times10^{22}$ cm$^{-3}$, from $1\times10^{17}$ cm$^{-3}$ to $1\times10^{21}$ cm$^{-3}$, from $1\times10^{18}$ cm$^{-3}$ to $1\times10^{20}$ cm$^{-3}$, from $1\times10^{18}$ cm$^{-3}$ to $1\times10^{19}$ cm$^{-3}$, or from $1\times10^{18}$ cm$^{-3}$ to $5\times10^{18}$ cm$^{-3}$).

In some examples, the photonic material has a spontaneous emission recombination rate per unit volume of $1\times10^{25}$ s$^{-1}$ cm$^{-3}$ or more at a carrier concentration of from $1\times10^{18}$ cm$^{-3}$ to $5\times10^{18}$ cm$^{-3}$ (e.g., $5\times10^{25}$ s$^{-1}$ cm$^{-3}$ or more, $1\times10^{26}$ s$^{-1}$ cm$^{-3}$ or more, $5\times10^{26}$ s$^{-1}$ cm$^{-3}$ or more, $1\times10^{27}$ s$^{-1}$ cm$^{-3}$ or more, $5\times10^{27}$ s$^{-1}$ cm$^{-3}$ or more, $1\times10^{28}$ s$^{-1}$ cm$^{-3}$ or more, $5\times10^{28}$ s$^{-1}$ cm$^{-3}$ or more, $1\times10^{29}$ s$^{-1}$ cm$^{-3}$ or more, or $5\times10^{29}$ s$^{-1}$ cm$^{-3}$ or more). In some examples, the photonic material can have a spontaneous emission recombination rate per unit volume of $1\times10^{30}$ s$^{-1}$ cm$^{-3}$ or less at a carrier concentration of from $1\times10^{18}$ cm$^{-3}$ to $5\times10^{18}$ cm$^{-3}$ (e.g., $5\times10^{29}$ s$^{-1}$ cm$^{-3}$ or less, $1\times10^{29}$ s$^{-1}$ cm$^{-3}$ or less, $5\times10^{28}$ s$^{-1}$ cm$^{-3}$ or less, $1\times10^{28}$ s$^{-1}$ cm$^{-3}$ or less, $5\times10^{27}$ s$^{-1}$ cm$^{-3}$ or less, $1\times10^{27}$ s$^{-1}$ cm$^{-3}$ or less, $5\times10^{26}$ s$^{-1}$ cm$^{-3}$ or less, $1\times10^{26}$ s$^{-1}$ cm$^{-3}$ or less, or $5\times10^{25}$ s$^{-1}$ cm$^{-3}$ or less). The spontaneous emission recombination rate per unit volume of the photonic material at a carrier concentration of from $1\times10^{18}$ cm$^{-3}$ to $5\times10^{18}$ cm$^{-3}$ can range from any of the minimum values described above to any of the maximum values described above. For example, the photonic material can have a spontaneous emission recombination rate of from $1\times10^{25}$ s$^{-1}$ cm$^{-3}$ to $1\times10^{30}$ s$^{-1}$ cm$^{-3}$ at a carrier concentration of from $1\times10^{18}$ cm$^{-3}$ to $5\times10^{18}$ cm$^{-3}$ (e.g., from $1\times10^{25}$ s$^{-1}$ cm$^{-3}$ to $1\times10^{27}$ s$^{-1}$ cm$^{-3}$, from $1\times10^{27}$ s$^{-1}$ cm$^{-3}$ to $1\times10^{30}$ s$^{-1}$ cm$^{-3}$, from $1\times10^{25}$ s$^{-1}$ cm$^{-3}$ to $1\times10^{26}$ s$^{-1}$ cm$^{-3}$, from $1\times10^{26}$ s$^{-1}$ cm$^{-3}$ to $1\times10^{27}$ s$^{-1}$ cm$^{-3}$, from $1\times10^{27}$ s$^{-1}$ cm$^{-3}$ to $1\times10^{28}$ s$^{-1}$ cm$^{-3}$, from $1\times10^{28}$ s$^{-1}$ cm$^{-3}$ to $1\times10^{29}$ s$^{-1}$ cm$^{-3}$, from $1\times10^{29}$ s$^{-1}$ cm$^{-3}$ to $1\times10^{30}$ s$^{-1}$ cm$^{-3}$, from $1\times10^{25}$ s$^{-1}$ cm$^{-3}$ to $1\times10^{29}$ s$^{-1}$ cm$^{-3}$, from $1\times10^{25}$ s$^{-1}$ cm$^{-3}$ to $1\times10^{28}$ s$^{-1}$ cm$^{-3}$, from $1\times10^{26}$ s$^{-1}$ cm$^{-3}$ to $1\times10^{30}$ s$^{-1}$ cm$^{-3}$, from $1\times10^{28}$ s$^{-1}$ cm$^{-3}$ to $1\times10^{30}$ s$^{-1}$ cm$^{-3}$, or from $5\times10^{25}$ s$^{-1}$ cm$^{-3}$ to $5\times10^{29}$ s$^{-1}$ cm$^{-3}$).

In some examples, the spontaneous emission spectrum of the photonic material exhibits a peak wavelength of 500 nm or more and the peak wavelength has an intensity of $1\times10^{25}$ s$^{-1}$ cm$^{-3}$ eV$^{-1}$ or more at a carrier concentration of from $1\times10^{18}$ cm$^{-3}$ to $5\times10^{18}$ cm$^{-3}$ (e.g., $5\times10^{25}$ s$^{-1}$ cm$^{-3}$ eV$^{-1}$ or more, $1\times10^{26}$ s$^{-1}$ cm$^{-3}$ eV$^{-1}$ or more, $5\times10^{26}$ s$^{-1}$ cm$^{-3}$ eV$^{-1}$ or more, $1\times10^{27}$ s$^{-1}$ cm$^{-3}$ eV$^{-1}$ or more, $5\times10^{27}$ s$^{-1}$ cm$^{-3}$ eV$^{-1}$ or more, $1\times10^{28}$ s$^{-1}$ cm$^{-3}$ eV$^{-1}$ or more, $5\times10^{28}$ s$^{-1}$ cm$^{-3}$ eV$^{-1}$ or more, $1\times10^{29}$ s$^{-1}$ cm$^{-3}$ eV$^{-1}$ or more, or $5\times10^{29}$ s$^{-1}$ cm$^{-3}$ eV$^{-1}$ or more). In some examples, the spontaneous emission spectrum of the photonic material exhibits a peak wavelength of 500 nm or more and the peak wavelength has an intensity of $1\times10^{30}$ s$^{-1}$ cm$^{-3}$ eV$^{-1}$ or less at a carrier concentration of from $1\times10^{18}$ cm$^{-3}$ to $5\times10^{18}$ cm$^{-3}$ (e.g., $5\times10^{29}$ s$^{-1}$ cm$^{-3}$ eV$^-$ or less, $1\times10^{29}$ s$^{-1}$ cm$^{-3}$ eV$^-$ or less, $5\times10^{28}$ s$^{-1}$ cm$^{-3}$ eV$^{-1}$ or less, $1\times10^{28}$ s$^{-1}$ cm$^{-3}$ eV$^{-1}$ or less, $5\times10^{27}$ s$^{-1}$ cm$^{-3}$ eV$^{-1}$ or less, $1\times10^{27}$ s$^{-1}$ cm$^{-3}$ eV$^-$ or less, $5\times10^{26}$ s$^{-1}$ cm$^{-3}$ eV$^-$ or less, $1\times10^{26}$ s$^{-1}$ cm$^{-3}$ eV$^-$ or less, or $5\times10^{25}$ s$^{-1}$ cm$^{-3}$ eV$^-$ or less). The intensity of the peak wavelength of the spontaneous emission spectrum of the photonic material at a carrier concentration of from $1\times10^{18}$ cm$^{-3}$ to $5\times10^{18}$ cm$^{-3}$ can range from any of the minimum values described above to any of the maximum values described above. For example, the spontaneous emission spectrum of the photonic material exhibits a peak wavelength of 500 nm or more and the peak wavelength has an intensity of from $1\times10^{25}$ s$^{-1}$ cm$^{-3}$ eV$^-$ to $1\times10^{30}$ s$^{-1}$ cm$^{-3}$ eV$^-$ at a carrier concentration of from $1\times10^{18}$ cm$^{-3}$ to $5\times10^{18}$ cm$^{-3}$ (e.g., from $1\times10^{25}$ s$^{-1}$ cm$^{-3}$ eV$^-$ to $1\times10^{27}$ s$^{-1}$ cm$^{-3}$ eV$^{-1}$, from $1\times10^{27}$ s$^{-1}$ cm$^{-3}$ eV$^-$ to $1\times10^{30}$ s$^{-1}$ cm$^{-3}$ eV$^{-1}$, from $1\times10^{25}$ s$^{-1}$ cm$^{-3}$ eV$^{-1}$ to $1\times10^{26}$ s$^{-1}$ cm$^{-3}$ eV$^{-1}$, from $1\times10^{26}$ s$^{-1}$ cm$^{-3}$ eV$^-$ to $1\times10^{27}$ s$^{-1}$ cm$^{-3}$ eV$^{-1}$, from $1\times10^{27}$ s$^{-1}$ cm$^{-3}$ eV$^-$ to $1\times10^{28}$ s$^{-1}$ cm$^{-3}$ eV$^{-1}$, from $1\times10^{28}$ s$^{-1}$ cm$^{-3}$ eV$^-$ to $1\times10^{29}$ s$^{-1}$ cm$^{-3}$ eV$^{-1}$, from $1\times10^{29}$ s$^{-1}$ cm$^{-3}$ eV$^-$ to $1\times10^{30}$ s$^{-1}$ cm$^{-3}$ eV$^{-1}$, from $1\times10^{25}$ s$^{-1}$ cm$^{-3}$ eV$^-$ to $1\times10^{29}$ s$^{-1}$ cm$^{-3}$ eV$^{-1}$, from $1\times10^{25}$ s$^{-1}$ cm$^{-3}$ eV$^-$ to $1\times10^{28}$ s$^{-1}$ cm$^{-3}$ eV$^{-1}$, from $1\times10^{26}$ s$^{-1}$ cm$^{-3}$ eV$^-$ to $1\times10^{30}$ s$^{-1}$ cm$^{-3}$ eV$^{-1}$, from $1\times10^{28}$ s$^{-1}$ cm$^{-3}$ eV$^{-1}$ to $1\times10^{30}$ s$^{-1}$ cm$^{-3}$ eV$^{-1}$, from $5\times10^{25}$ s$^{-1}$ cm$^{-3}$ eV$^-$ to $5\times10^{29}$ s$^{-1}$ cm$^{-3}$ eV$^{-1}$, or from $5\times10^{26}$ s$^{-1}$ cm$^{-3}$ eV$^{-1}$ to $5\times10^{29}$ s$^{-1}$ cm$^{-3}$ eV$^{-1}$).

Also described herein are light emitting diodes (LEDs) comprising a quantum well structure, wherein the quantum well structure can comprise the any of the photonic materials described herein. Also described herein are semiconductor lasers, photovoltaics (solar cell devices), photodetectors, and the like comprising any of the photonic materials described herein.

Also disclosed herein are methods of making the photonic materials described herein. For example, the methods can comprise depositing each layer in the appropriate order, wherein each layer can be deposited by epitaxial growth methods such as metalorganic chemical vapor deposition (MOCVD) (such as pulsed MOCVD), molecular beam epitaxy (MBE), or pulsed laser deposition (PLD) or combinations thereof. In some examples, the methods can comprise pulsed MOCVD.

A number of embodiments of the invention have been described. Nevertheless, it will be understood that various modifications may be made without departing from the spirit and scope of the invention. Accordingly, other embodiments are within the scope of the following claims.

The examples below are intended to further illustrate certain aspects of the systems and methods described herein, and are not intended to limit the scope of the claims.

EXAMPLES

The following examples are set forth below to illustrate the methods and results according to the disclosed subject matter. These examples are not intended to be inclusive of all aspects of the subject matter disclosed herein, but rather to illustrate representative methods and results. These examples are not intended to exclude equivalents and variations of the present invention which are apparent to one skilled in the art.

Efforts have been made to ensure accuracy with respect to numbers (e.g., amounts, temperature, etc.) but some errors and deviations should be accounted for. Unless indicated otherwise, parts are parts by weight, temperature is in ° C. or is at ambient temperature, and pressure is at or near atmospheric. There are numerous variations and combinations of measurement conditions, e.g., component concentrations, temperatures, pressures and other measurement ranges and conditions that can be used to optimize the described process.

Example 1—High Efficiency LED Designs Using Quantum Well Engineering

Although extensive research and development over the past two decades has resulted in close to 100% external quantum efficiency (EQE) of InGaN based blue light emitting devices (Damilano et al. *J Phys. D: Appl. Phys.* 2015, 48, 40300), efficiency of the longer visible wavelength emitting devices has remained relatively low. Spontaneous polarization originating from the absence of inversion symmetry in the wurtzite structure (Keller et al. *Semicond. Sci. Technol.* 2014, 29, 113001) and piezoelectric polarization caused by the lattice mismatch induced strain (Han et al. *J Appl. Phys.* 2016, 120, 103102) in InGaN quantum wells (QWs) based light-emitting devices render internal electric field and concomitant localization of electron and holes in different regions of the QW (Damilano et al. *J Phys. D: Appl. Phys.* 2015, 48, 403001). The problem deteriorates with increase in In content and QW width and suppresses the efficiency of InGaN based devices emitting green or longer wavelengths.

The attempts made to date to address the efficiency issue in InGaN based green and longer wavelength emitting devices include minimization of the charge separation by using non-polar or semi-polar InGaN (Han et al. *J Appl. Phys.* 2016, 120, 103102), staggered InGaN QW (Zhao et al. *Opt. Express* 2011, 19, A991), strain-compensated InGaN/AlGaN QW (Zhao et al. *IEEE J. Quantum Electron.* 2009, 45, 66; Zhao et al. *Opt. Quantum Electron.* 2008, 40, 301), type-II InGaN/GaNAs QW (Arif et al. *Appl. Phys. Lett.* 2008, 92, 011104) and InGaN-delta InN QW (Zhao et al. *Appl. Phys. Lett.* 2010, 97, 131114). Recently, Han et al. proposed a type-II InGaN/ZnGeN$_2$ QW based design for blue and green light-emitting diodes in which ZnGeN$_2$ layer sandwiched between two InGaN layers significantly improves the electron- and hole-wave function overlap ($\Gamma_{e-h}$) by hole confinement due to its large band offsets with InGaN (Han et al. *J. Appl. Phys.* 2016, 120, 103102).

Previously, Zhao et al. proposed a QW structure design based on InGaN/ZnSnN$_2$ QW structure (U.S. Pat. No. 11,355,668). A thin layer of ZnSnN$_2$ is inserted in an InGaN QW, aiming to enhance the electron-hole wavefunction overlap and thus to increase the radiative efficiency.

Herein, (Zn$_a$Sn$_b$Ge$_c$)$_x$Ga$_{1-x}$N$_2$ is inserted in the InGaN QW. As shown in FIG. 1, the total thickness of the QW is L$_{QW}$, and the thickness of the (Zn$_a$Sn$_b$Ge$_c$)$_x$Ga$_{1-x}$N$_2$ layer is L. The position of the (Zn$_a$Sn$_b$Ge$_c$)$_x$Ga$_{1-x}$N$_2$ layer can be tuned from the left of the QW (z=0) to the right of the QW (z=L$_{QW}$-L). The (Zn$_a$Sn$_b$Ge$_c$)$_x$Ga$_{1-x}$N$_2$ material represents an alloy of II-IV-N$_2$ [Zn$_a$Sn$_b$Ge$_c$N$_2$] and GaN. The Ga composition 1-x can be tuned between 0 and <1. For the special case when 1-x=0, the material becomes Zn$_a$Sn$_b$Ge$_c$N$_2$. When the group II (Zn)/group IV (Sn+Ge) atomic ratio a/(b+c)=1, it represents the stoichiometric Zn(Sn$_b$Ge$_{1-b}$)N$_2$. The ratio of the group IV elements Sn and Ge b/c can vary between 0:1 to 1:0. The In compositions in the InGaN sublayers y and z can be different. The band offsets between the InGaN and (Zn$_a$Sn$_b$Ge$_c$)$_x$Ga$_{1-x}$N$_2$: ΔE$_c$, ΔE$_v$ vary depending on the alloy compositions. In order to achieve a good confinement of the hole wavefunction close to the center of the QW in the valence band, the Ga composition should be kept<=70%. Due to the lighter electron effective mass in the conduction band, the band structure engineering will have a weaker impact on the electron wavefunction. Pure GaN can be used as barrier on both sides of the QWs. In order to improve the electron confinement in the conduction band, a larger barrier height AlGaN layer can be implemented. The Al composition w can vary between 0 and 1, and the thickness of the AlGaN layer L$_{AlGaN}$ can vary between 0 and L$_{GaN}$.

The design of the QW structure is based on experimental findings on the MOCVD growth of ZnSn(Ga)N$_2$. A pulsed MOCVD growth technique was implemented to achieve Sn-droplets-free ZnSnN$_2$ thin films grown at elevated temperatures. DEZn, TMSn, TMGa and ammonia were used as the precursors for Zn, Sn, Ga and N, respectively. The TMGa and NH$_3$ molar flow rates were set at 90.63 μmol/min and 178 μmol/min, respectively. For the ZnSn(Ga)N$_2$ growth, the reactor pressure was set at 500 Torr and growth temperature varied from 560° C. to 580° C. The DEZn, TMSn and NH$_3$ molar flow rates were set at 36.58 μmol/min, 36.48 μmol/min and 201 μmol/min, respectively.

Figure 2:
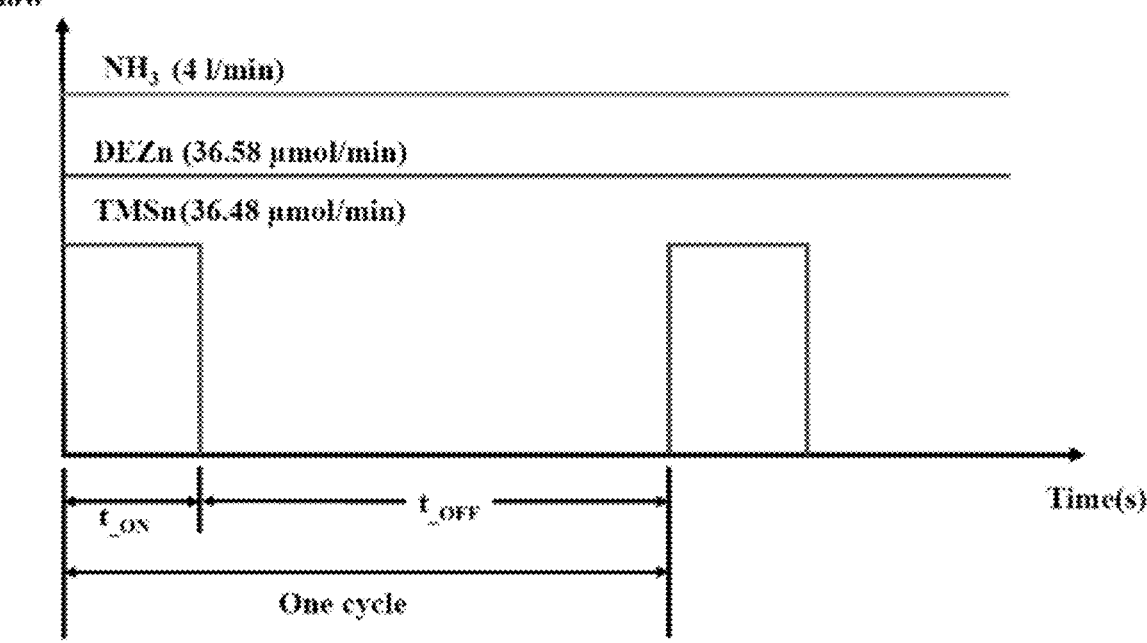
FIG. 2. Schematic diagram of precursor flow rates in each cycle for the pulsed-mode MOCVD growth of $ZnSn(Ga)N_2$.

For the TMSn pulsed-mode growth, the TMSn flow is designed with periodic on and off, while maintaining constant flow rates of DEZn and NH$_3$. FIG. 2 shows the schematic diagram of the pulsed-mode growth. While the DEZn and NH$_3$ were kept at constant flow rates, the TMSn flow rate was controlled with t$_{ON}$ (flowing to chamber) and t$_{OFF}$ (bypass) for each pulsing cycle. This pulsing cycle was repeated N$_c$ times.

Figure 3:
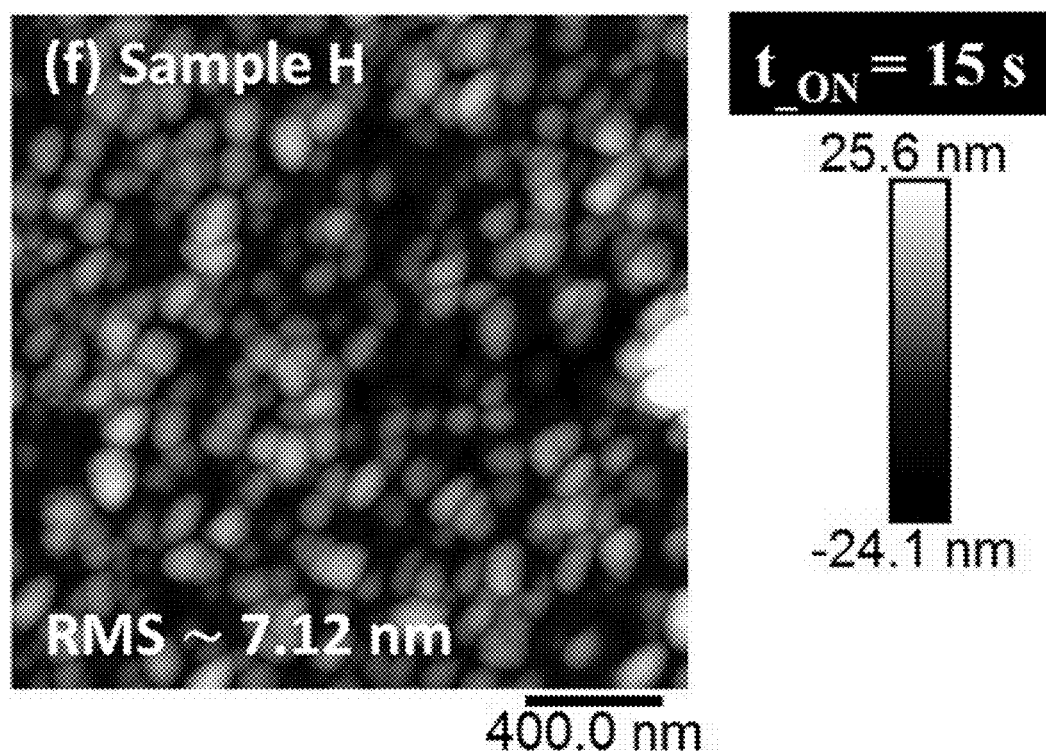
FIG. 3. AFM image (2 μm×2 μm) of $ZnSn(Ga)N_2$ film grown with TMSn-pulsing time (f) 15 s-ON, 45 s-OFF (Sample H).

FIG. 3 demonstrates the high quality ZnSn(Ga)N$_2$ film growth with good surface morphology and RMS of 7.12 nm.

Figure 4A:
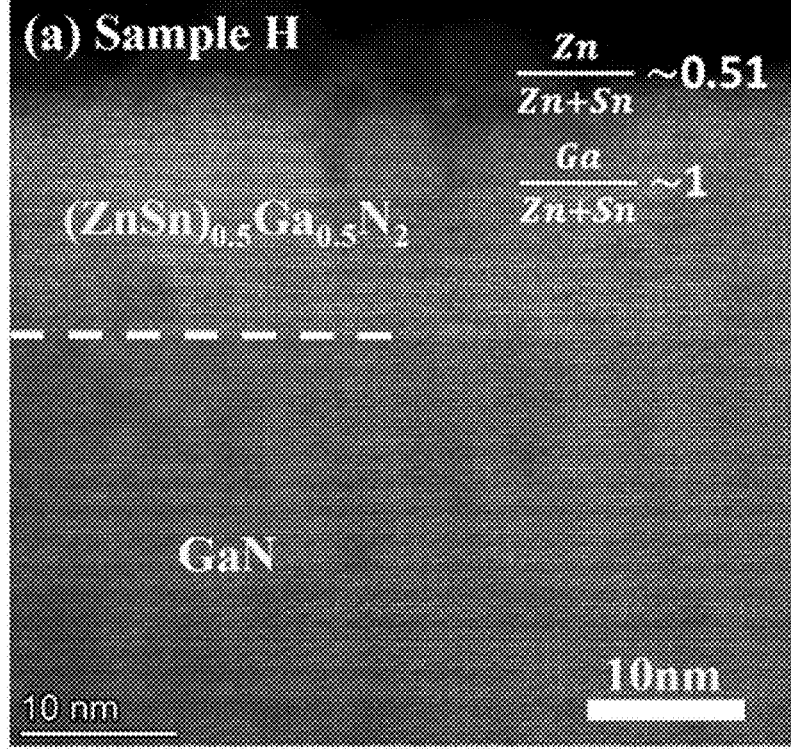
FIG. 4A. Cross-sectional TEM imaging of Sample H. The interface is marked by a white dash lines.
Figure 4B:
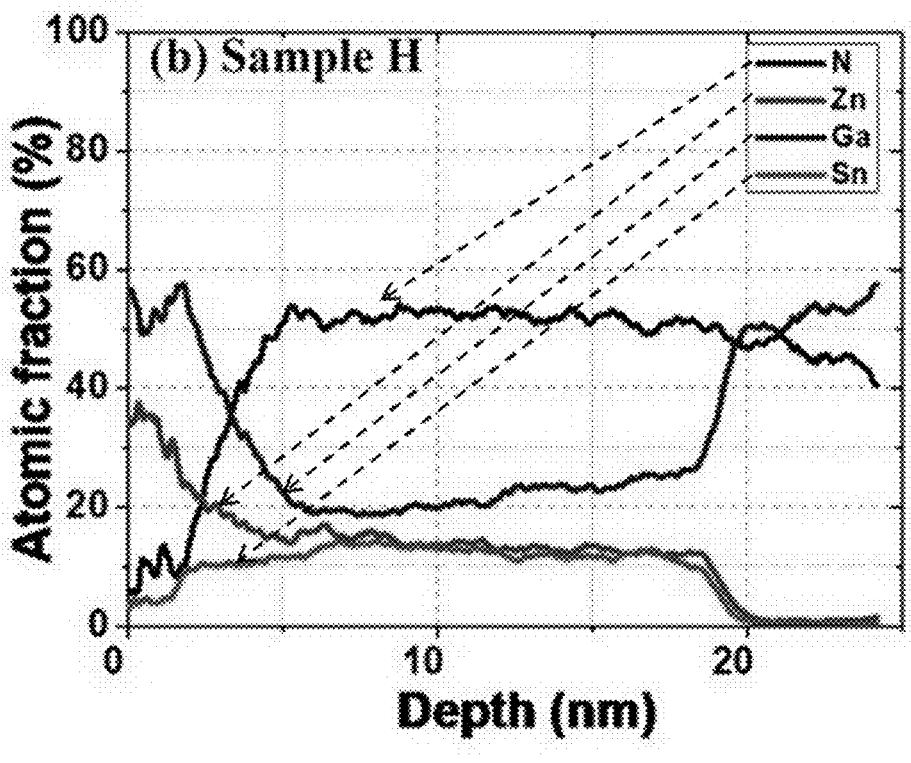
FIG. 4B. Atomic fractions plotted based on the TEM_EDX results of Sample H.

The cross-sectional TEM image for Sample H is shown in FIG. 4A, revealing high crystalline quality and a stoichiometric Zn/Sn ratio. The white dash line marks the ZnSn(Ga)N$_2$/GaN interface which shows a sharp interface with epitaxial relationship. From TEM_EDX measurements, as plotted in FIG. 4B, the grown film has a stoichiometric Zn/Sn ratio and 50% GaN alloy. The series of MOCVD growth studies demonstrate that pulsed-mode MOCVD growth is feasible to achieve Sn-droplet-free growth of ZnSn(Ga)N$_2$ films. An in-situ GaN regrowth layer and optimized TMSn-pulsing period can achieve high quality ZnSn(Ga)N$_2$ film growth.

XPS measurements were used to determine the valence band offset between (ZnSn)$_{0.5}$Ga$_{0.5}$N$_2$ and GaN using three samples: a 20-nm-thick GaN sample, a 20-nm-thick (ZnSn)$_{0.5}$Ga$_{0.5}$N$_2$ sample and a 2-nm-thick (ZnSn)$_{0.5}$Ga$_{0.5}$N$_2$/GaN heterostructure sample. The core energy levels and the positions of the VBM determined for the (ZnSn)$_{0.5}$Ga$_{0.5}$N$_2$ samples are listed in Table 1.

TABLE 1

| | Bandgap energy (eV) | Core levels (CL) | $E_{CL(GaN)}^{GaN} -$ $E_{VBM}^{GaN}$ (eV) | $E_{CL((ZnSn)_{0.5}Ga_{0.5}N_2)}^{(ZnSn)_{0.5}Ga_{0.5}N_2} -$ $E_{VBM}^{(ZnSn)_{0.5}Ga_{0.5}N_2}$ (eV) | | $E_{CL(GaN)}^{Interface} -$ $E_{CL((ZnSn)_{0.5}Ga_{0.5}N_2)}^{Interface}$ (eV) |
|---|---|---|---|---|---|---|
| (ZnSn)$_{0.5}$Ga$_{0.5}$N$_2$ | 2.6 | | | Sn 3 d$_{5/2}$ | Zn 3d$_{5/2}$ | Sn 3d$_{5/2}$ |
| GaN | 3.4 | Ga2 p$_{3/2}$ | 1115.23 | 484.98 | 8.39 | 631.18 |
| | | Ga 3s | 157.90 | | | −326.11 |
| | | Ga3 d$_{5/2}$ | 17.16 | | | −467.01 |

The valance and conduction band offsets at the (ZnSn)$_{0.5}$Ga$_{0.5}$N$_2$/GaN interface, extracted from the valance band spectra, Ga 2p$_{3/2}$, Ga 3d$_{3/2}$, Sn 3d$_{5/2}$ and Zn 3d$_{5/2}$ core levels.

TABLE 1-continued

The valance and conduction band offsets at the $(ZnSn)_{0.5}Ga_{0.5}N_2$/GaN interface, extracted from the valance band spectra, Ga $2p_{3/2}$, Ga $3d_{3/2}$, Sn $3d_{5/2}$ and Zn $3d_{5/2}$ core levels.

| | $E_{CL(GaN)}{}^{Interface} - E_{CL((ZnSn)_{0.5}Ga_{0.5}N_2)}{}^{Interface}$ (eV) | | Valence band offset $\Delta E_v$ (eV) | Conduction band offset $E_c$ (eV) | |
|---|---|---|---|---|---|
| | Zn $3d_{5/2}$ | Sn $3d_{5/2}$ | Zn $3d_{5/2}$ | Sn $3d_{5/2}$ | Zn $3d_{5/2}$ |
| $(ZnSn)_{0.5}Ga_{0.5}N_2$ | 1107.66 | −0.94 | −0.82 | 0.14 | 0.02 |
| GaN | 150.37 | −0.97 | −0.85 | 0.17 | 0.05 |
| | 9.46 | −0.81 | −0.69 | 0.01 | −0.11 |

Figure 5:
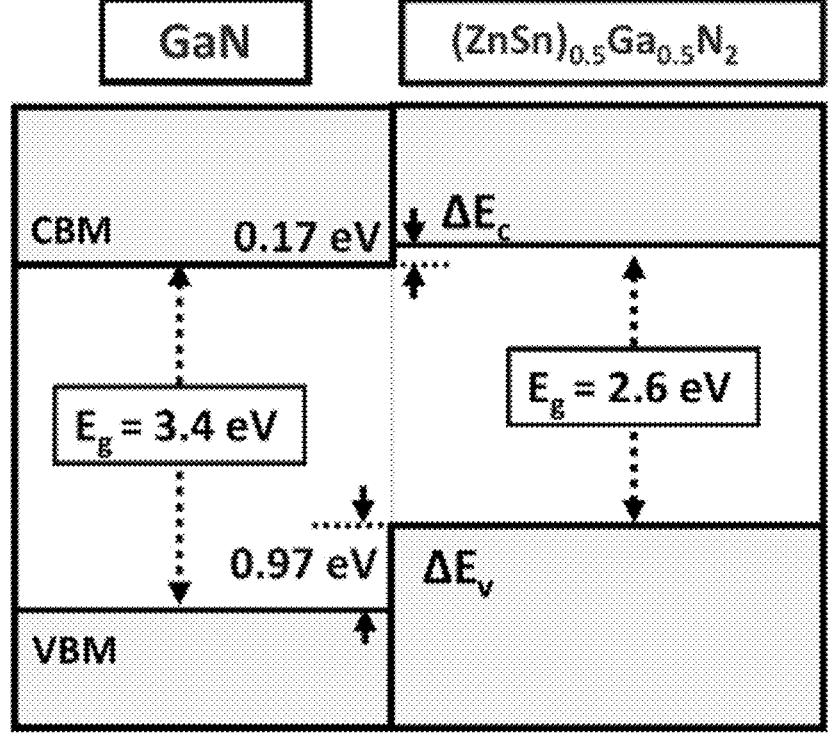
FIG. 5. The experimentally measured band alignments at the $(ZnSn)_{0.5}Ga_{0.5}N_2/GaN$ interface.

The average of the determined valence band offsets using the Zn 3d and Sn 3d bands was used to align the valence band maxima of $(ZnSn)_{0.5}Ga_{0.5}N_2$ relative to the VBM of GaN. Therefore, the VBO between $(ZnSn)_{0.5}Ga_{0.5}N_2$ and GaN was extracted to be 0.97±0.05 eV. The band alignments of $(ZnSn)_{0.5}Ga_{0.5}N_2$ with GaN are shown in FIG. 5 using the average of the VBO values determined using the Zn 3d and Sn 3d bands.

Example 2—High Efficiency InGaN LEDs Emitting in Green Amber, and Beyond

Figure 6:
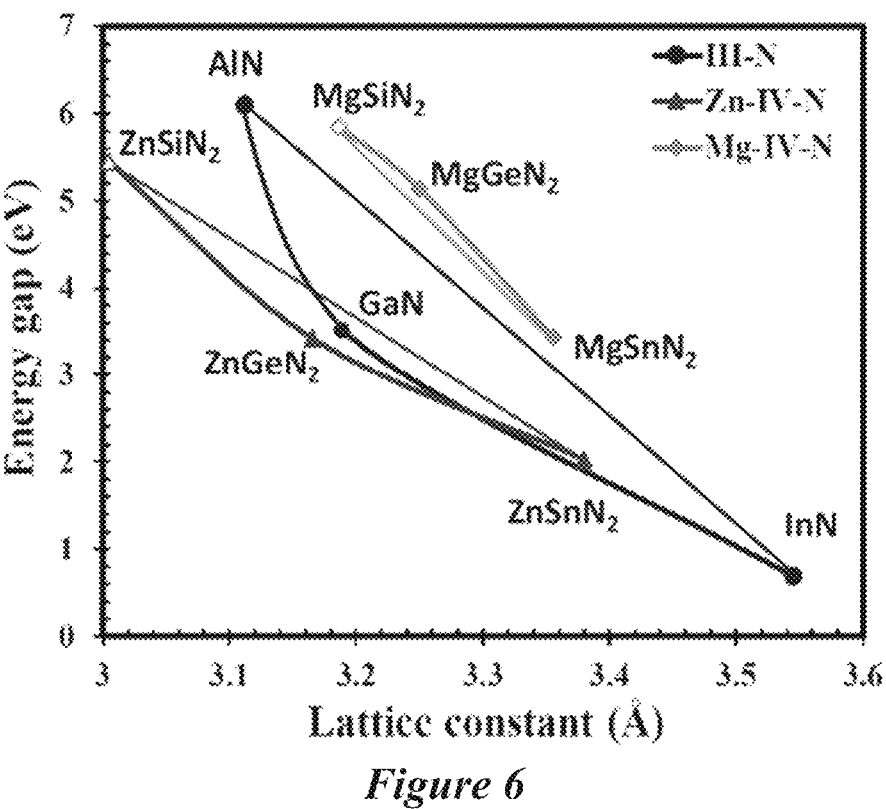
FIG. 6. Lattice constants vs. energy gap for various III-N, Zn-IV-N, and Mg-IV-N compositions.
Figure 7:
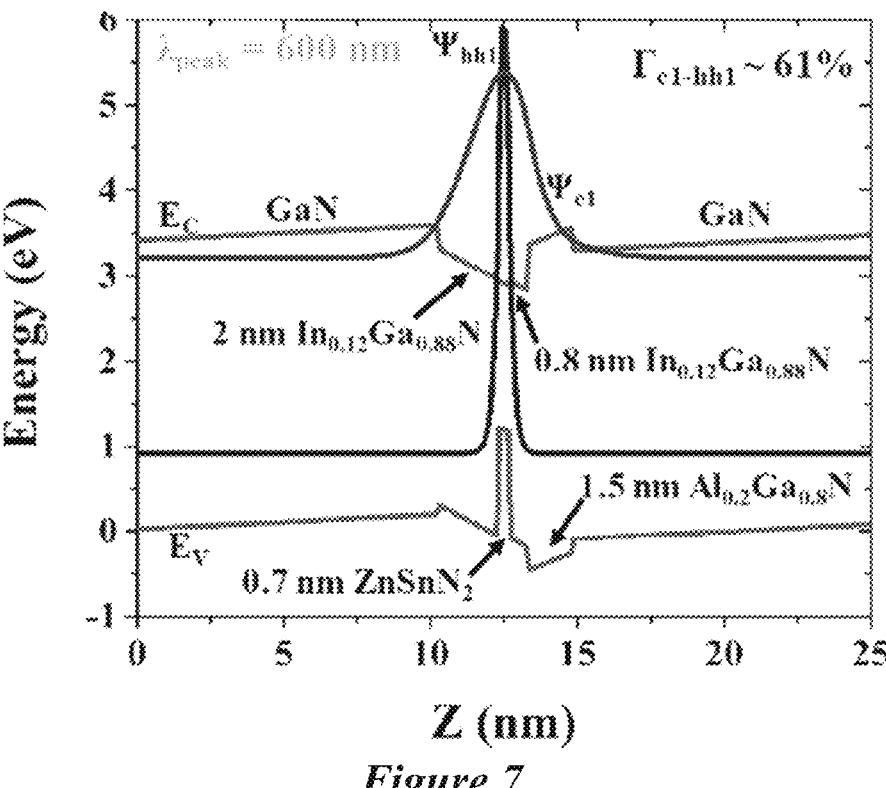
FIG. 7. Energy band diagram for an example quantum well with a peak emission at 600 nm.

Described herein are high efficiency LEDs with green, amber and longer wavelengths using III-nitride/II-IV-nitride heterostructures as the active media. MOCVD development of heterostructures composed of low-indium-content InGaN and $ZnGeN_2$ or $ZnSnN_2$ are used to exceed the current technology based on the phosphor-converted LEDs (FIG. 6, FIG. 7). This approach takes advantage of increased flexibility to tune the quantum well active region to lower the emission wavelengths and increase the electron-hole wavefunction overlap to pave a new way to extend the InGaN quantum well LED emission wavelength without using high-indium-content InGaN, and with greatly improved internal quantum efficiency.

Described herein are experiments designed to achieve high efficiency LEDs in green, amber and longer wavelengths using III-N/II-IV-$N_2$ heterostructures. Using the closely lattice-matched materials and their large band offsets, this concept provides opportunities to extend the emission wavelength for InGaN QWs using low In content.

The MOCVD growth window for high crystalline quality $ZnGeN_2$ and $ZnSnN_2$ is investigated. (In)GaN—$ZnGeN_2$ QWs green LEDs with IQE>60% and InGaN—$ZnSnN_2$ QW amber LEDs with IQE>50% (optical) is also investigated. Electrically injected green LEDs with IQE>60% and amber LEDs with IQE>50% are investigated.

Figure 8:
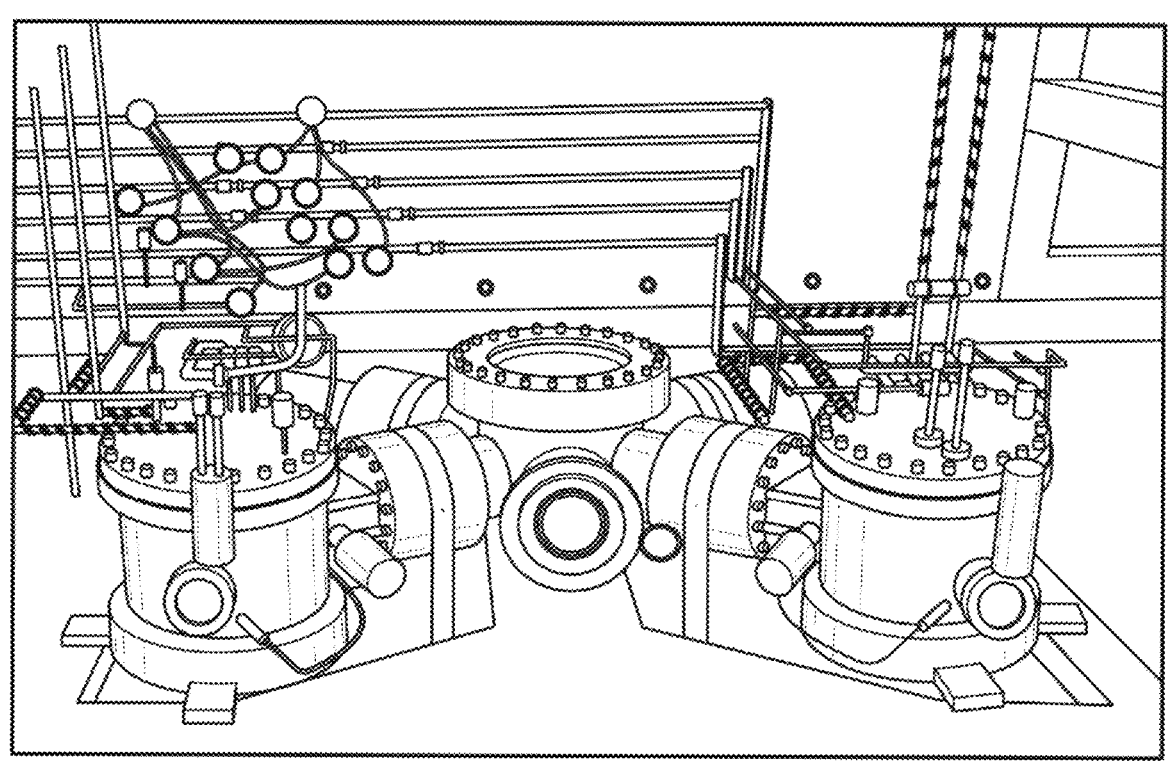
FIG. 8. III-N and $II-IV-N_2$ Dual-Chamber MOCVD set up.
Figure 9:
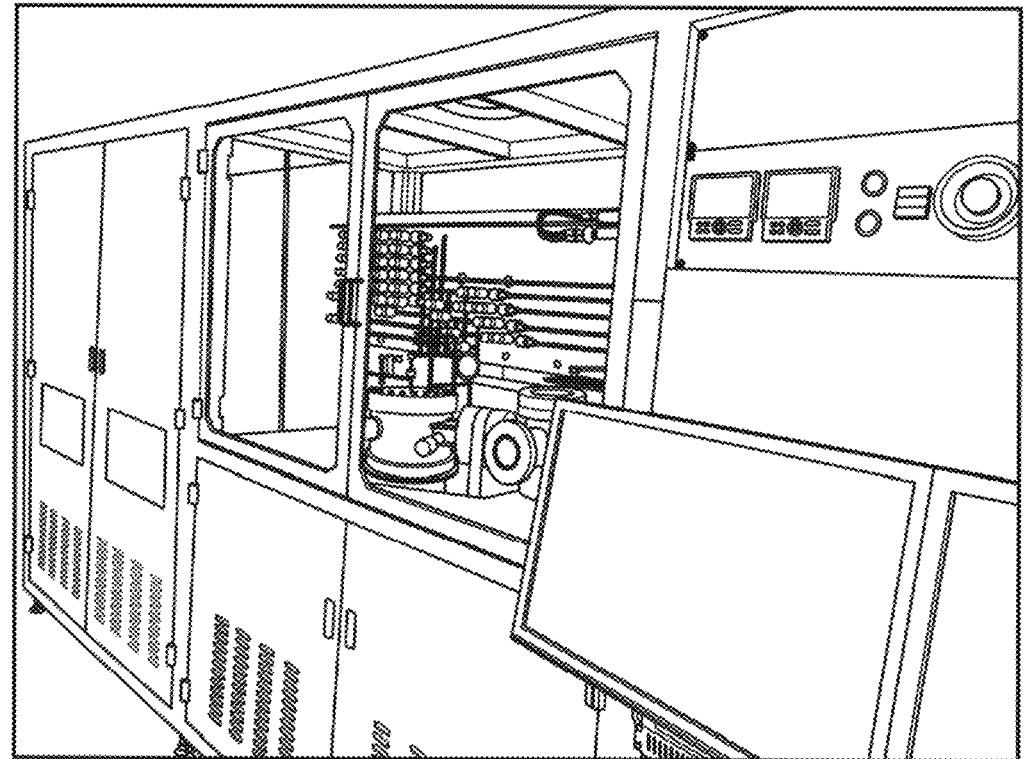
FIG. 9. III-N and $II-IV-N_2$ Dual-Chamber MOCVD set up.

A III-N and II-IV-$N_2$ Dual-Chamber MOCVD set up can be used (FIG. 8, FIG. 9), which has 5 hydride gas channels and 7 alkyl channels. The five hydride channels include: $SiH_4$/He (regular), $SiH_4H_2$ (double dilution), $GeH_4$/He (regular), Spare (space for future hydride source on panel), $NH_3$ (1 channel), and $H_2$ (carrier gas, switchable to $N_2$ carrier gas). The 7 alkyl channels include: TMAl (double dilution), TMG1 (double dilution), TEG1 (regular), TMI 1 (regular), CP2MG1 (regular), DEZn (regular), and Tetramethylstannane ($CH_4H_{12}Sn$). There are no other reports of growth of the II-IV-nitrides by MOCVD. Further, there are no other dual chamber configurations that can support growth of both the II-IV-nitrides and the III-nitrides.

Figure 10:
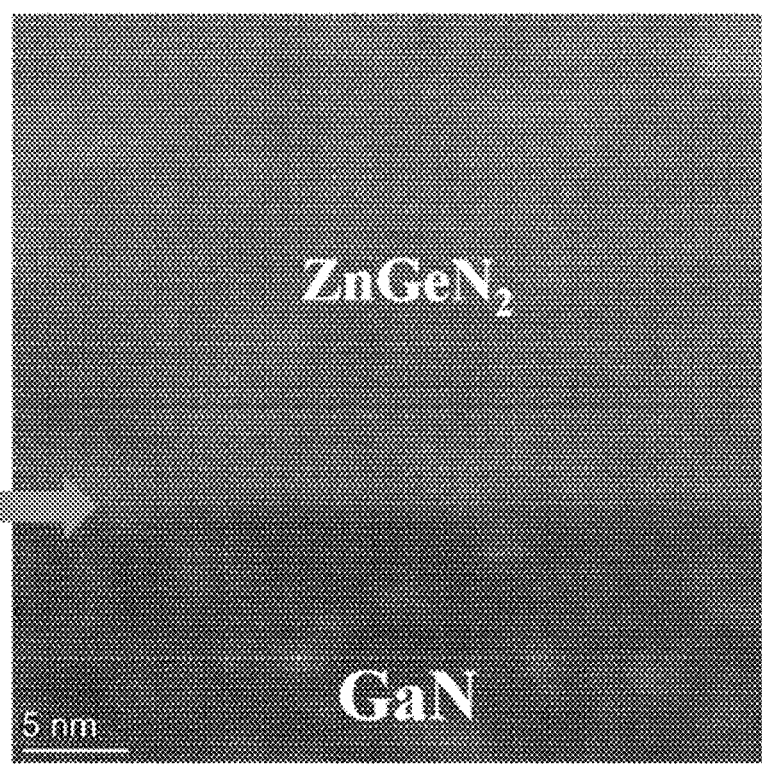
FIG. 10. Single crystalline $ZnGeN_2$ grown on GaN via MOCVD.
Figure 11:
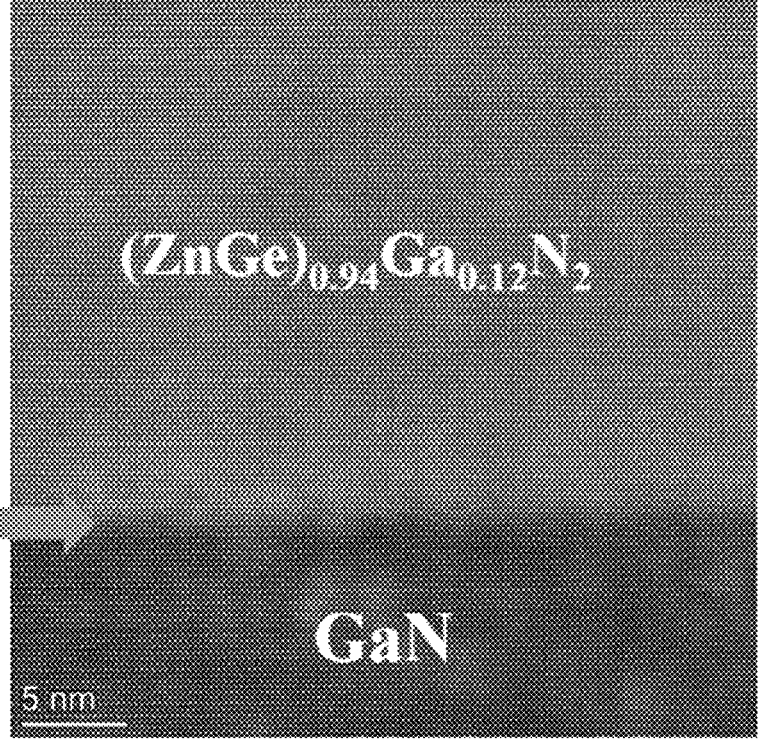
FIG. 11. Single crystalline $(ZnGe)_{0.94}Ga_{0.12}N_2$ grown on GaN via MOCVD.
Figure 12:
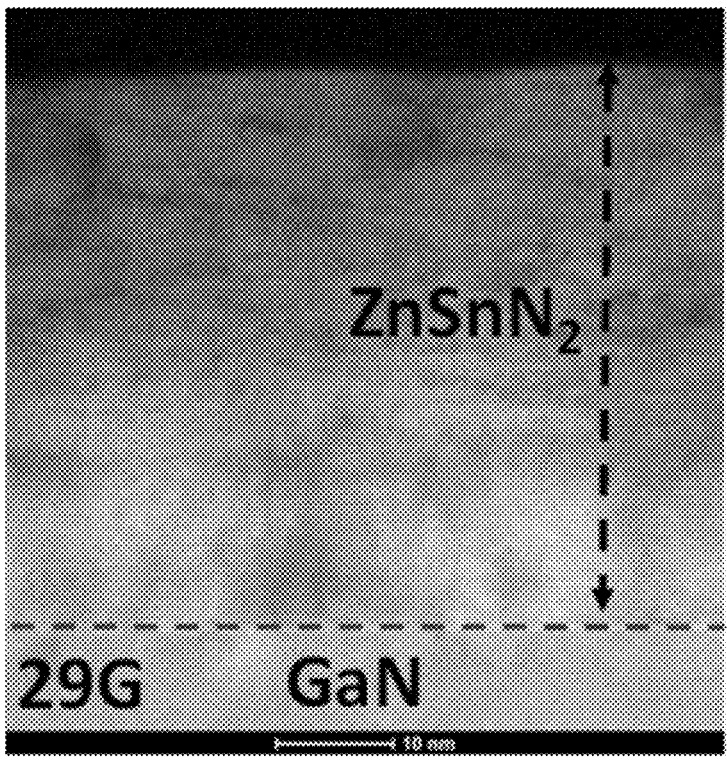
FIG. 12. Single crystalline $ZnSnN_2$ grown on GaN via MOCVD.
Figure 13:
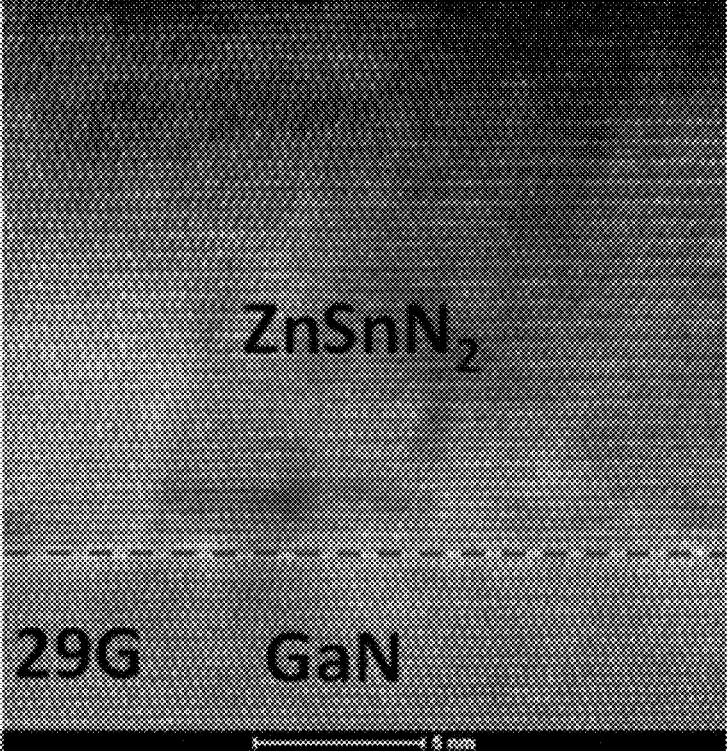
FIG. 13. Single crystalline $ZnSnN_2$ grown on GaN via MOCVD.
Figure 14:
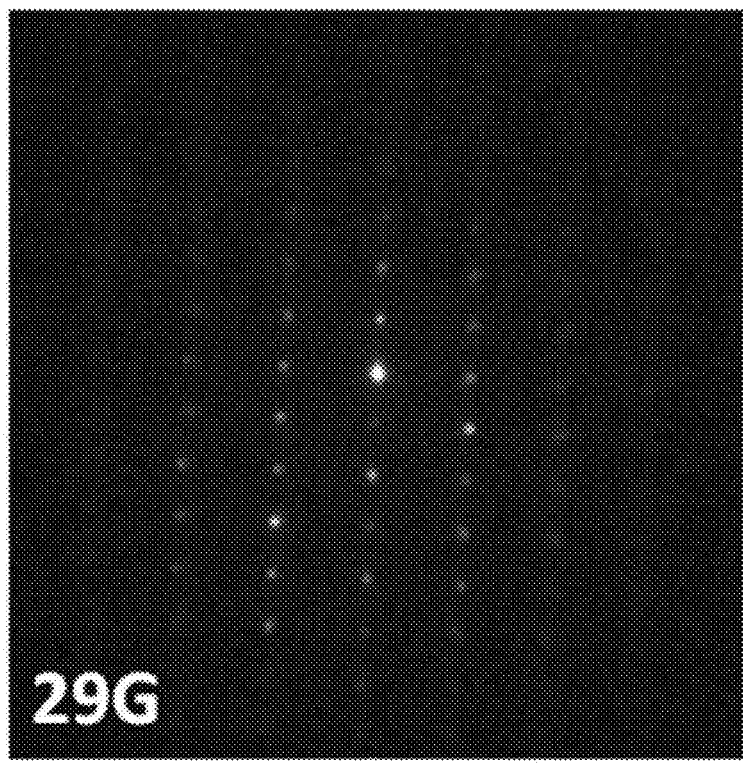
FIG. 14. Single crystalline $ZnSnN_2$ grown on GaN via MOCVD.

The device demonstrated MOCVD growth of single crystalline $ZnGe(Ga)N_2$ on GaN, with high crystalline quality with sharp interfaces (FIG. 10-FIG. 11) (Karim et al. *J Phys. D: Appl. Phys.* 2021, 54(24), 245102).

The device demonstrated MOCVD growth of single crystalline $ZnSn(Ga)N_2$ on GaN (FIG. 12-FIG. 14, FIG. 4A, and FIG. 4B).

Figure 15:
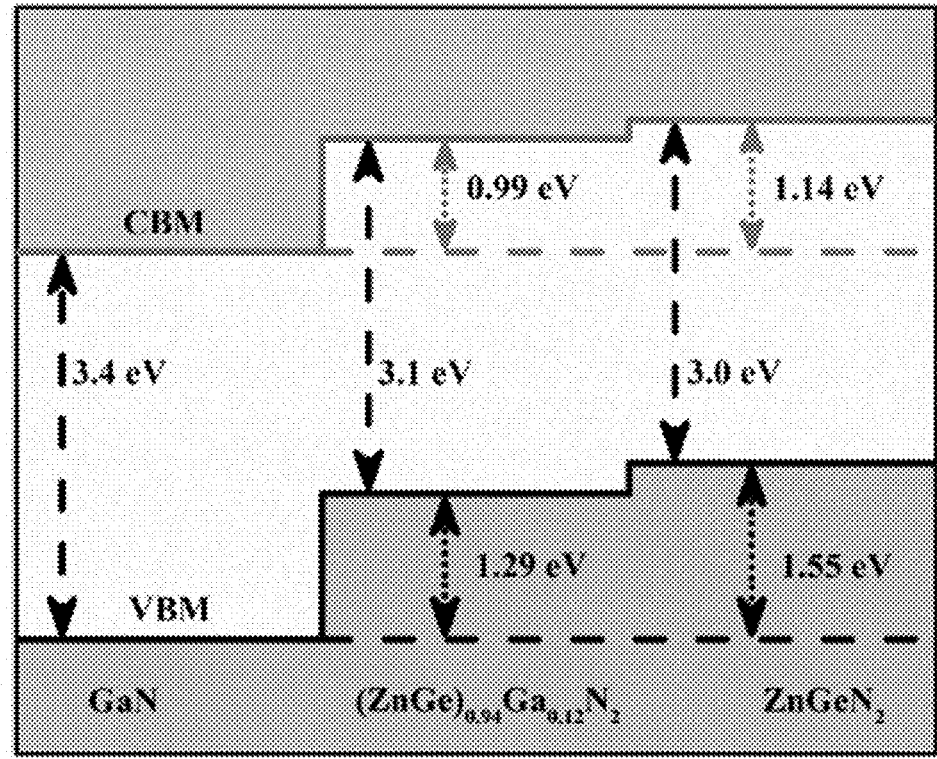
FIG. 15. Band offsets between $II-IV-N_2$ and GaN.

Large band offsets were determined between II-IV-$N_2$/GaN (FIG. 5 and FIG. 15) via XPS measurements. The first experimental determination of the band offset between $ZnGeN_2$/GaN: $\Delta E_c$=1.55 eV. The first experimental determination of the band offset between $(ZnSn)_{0.5}Ga_{0.5}N_2$/GaN: $\Delta E_c$=0.97 eV.

Figure 16:
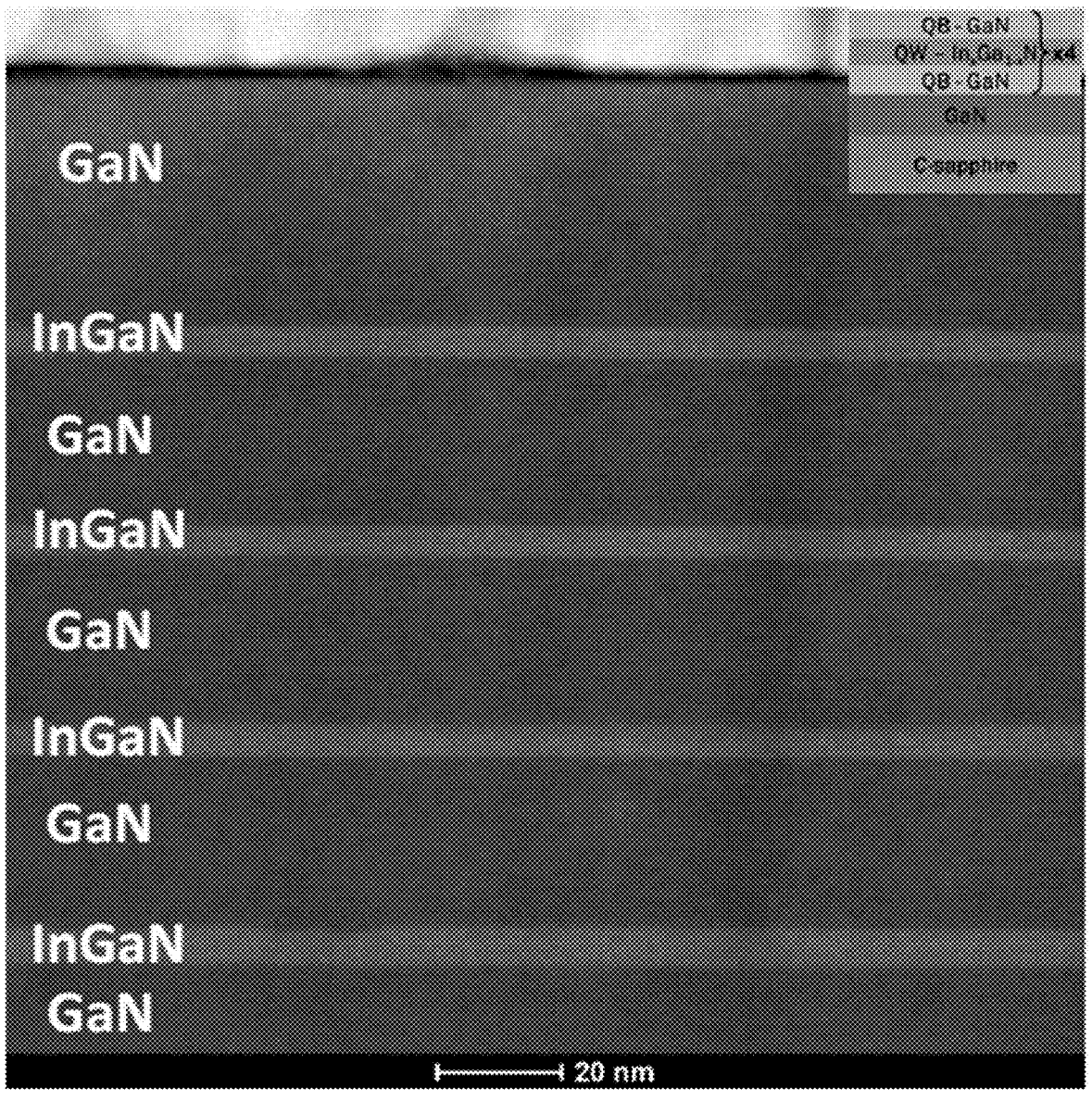
FIG. 16. Cross-sectional STEM image of a conventional InGaN QW.
Figure 17:
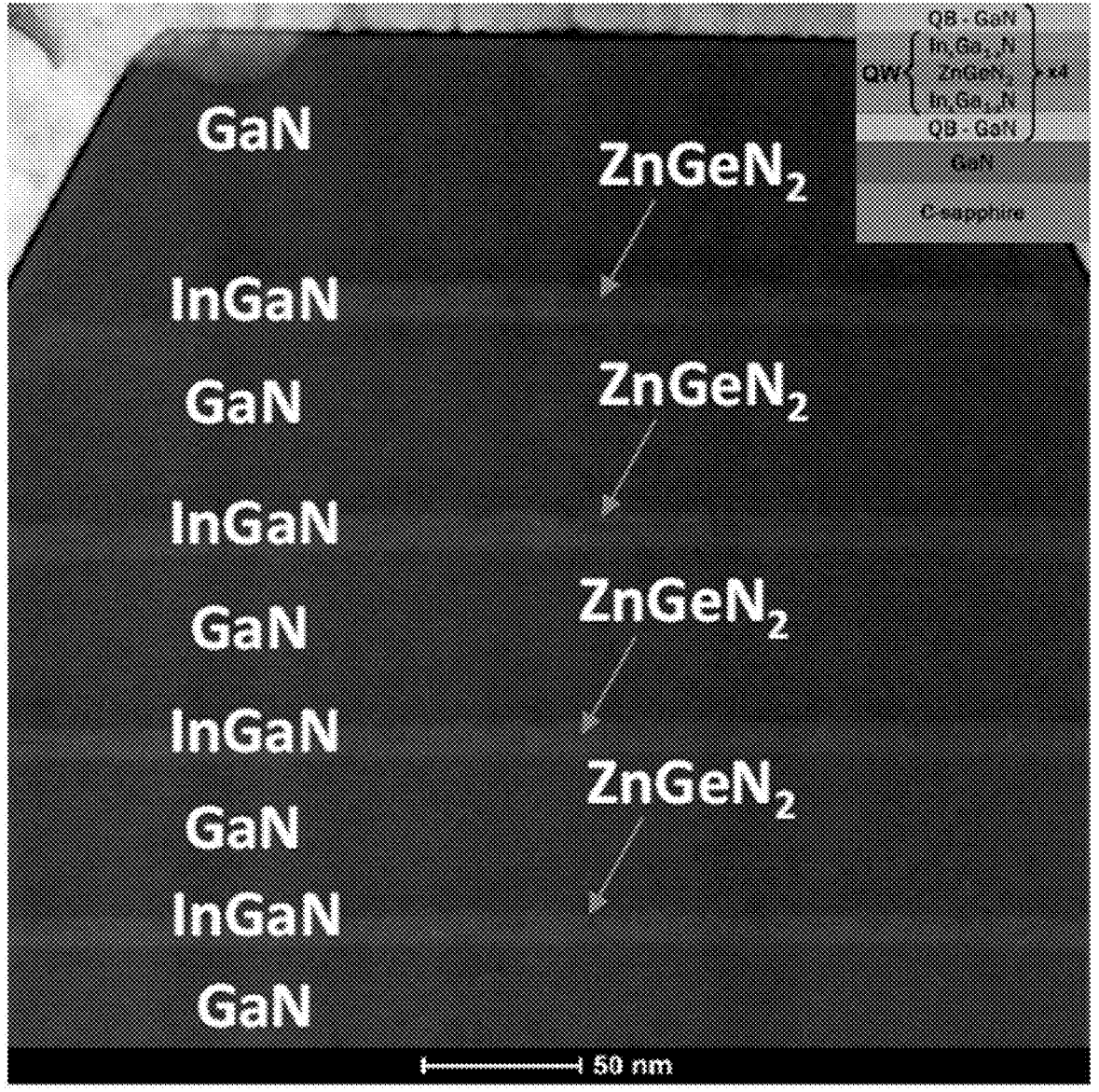
FIG. 17. Cross-sectional STEM image of a InGaN/Zn-$GeN_2$/InGaN heterostructure QW.

InGaN/$ZnGeN_2$ heterostructure QWs were realized. Cross-sectional STEM images of a conventional InGaN QW and a InGaN/$ZnGeN_2$/InGaN heterostructure QW are shown in FIG. 16 and FIG. 17, respectively (Karim et al. *ACS Crys. Growth Des.* 2022, 22(1), 131-139).

Figure 18:
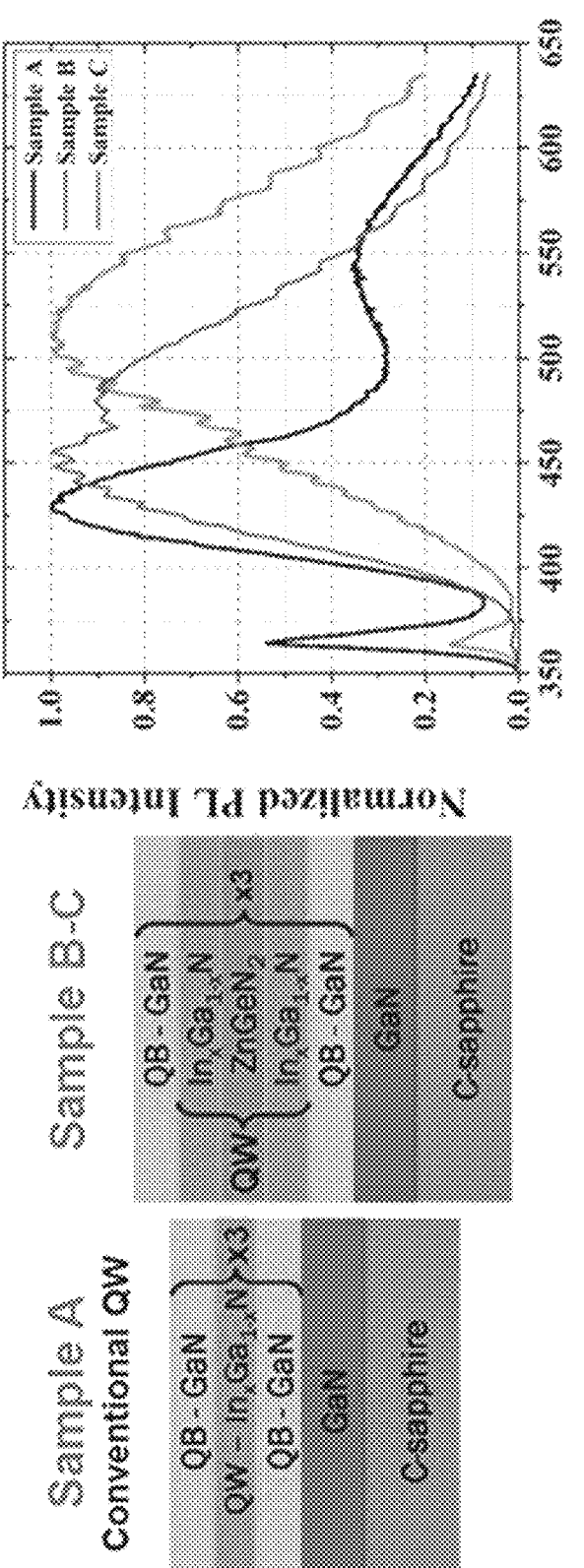
FIG. 18. Emission wavelength of the IGN/ZGN QWs.

The emission wavelength of the IGN/ZGN QWs red shifts as compared to the conventional QW and the magnitude of the shift is dependent on the location of the $ZnGeN_2$ layer (FIG. 18).

Electrical injected InGaN/II-IV-$N_2$ heterostructure QWs LEDs are being investigated. Electroluminescence wavelength tuning by optimizing II-IV-$N_2$ layer position or thickness is being investigated.

Example 3—Design of InGaN—$ZnSnGa_2N_4$ Quantum Wells for High-Efficiency Amber Light Emitting Diodes Abstract. A type-II InGaN—$ZnSnGa_2N_4$ quantum well (QW) structure is proposed and studied as the active region for high efficiency amber (λ~590 nm) light emitting diodes (LEDs), which is currently a great challenge in pure InGaN based LEDs. A thin $ZnSnGa_2N_4$ (e.g., $(ZnSn)_{0.5}GaN_2$) layer is inserted in the InGaN QW to enhance the hole wavefunction confinement in the valence band and an AlGaN layer is incorporated in the quantum barrier to help better confine the electron wavefunction in the conduction band. The band structure of the InGaN—$ZnSnGa_2N_4$ QW is numerically simulated based on the experimentally measured band offsets between $ZnSnGa_2N_4$ and GaN. With the InGaN—$ZnSnGa_2N_4$ QW design, a low In content (20%) is needed in the InGaN layer to reach a peak emission wavelength of ~590 nm, yet a In composition of 25% is needed to reach the same emission wavelength for the conventional InGaN QW with the same layer thicknesses. Moreover, the electron-hole wavefunction overlap ($\Gamma_{e1-hh1}$) for the InGaN—$ZnSnGa_2N_4$ QW design reaches 18% for an emission wavelength at ~590 nm, which is much improved from the conventional InGaN QW (5%) emitting at the same wavelength. The increase in electron-hole wavefunction overlap results in an approximately 14 times enhancement in the spontaneous emission radiative recombination rate of the InGaN—$ZnSnGa_2N_4$ QW as compared to that of the conventional InGaN QW with higher In composition. The InGaN—ZnSnGa$_2$N$_4$ QW structure design can be promising to pave a new way to achieve high efficiency amber LEDs.

Introduction. In the past decades, significant efforts were involved in improving the performance of InGaN based green, yellow, and amber light emitting diodes (LEDs), particularly the high efficiency LEDs already achieved by InGaN (blue) and III-V (red) material systems. Although the InGaN based LED efficiency has been enhanced significantly (Lv et al. *ACS Photonics* 2019, 6, 130; Alhassan et al. *Opt. Express* 2016, 24, 17868; Jiang et al. *Photonics Res.* 2019, 7, 144; Marcinkevičius et al. *Appl. Phys. Lett.* 2021, 119, 071102), the efficiency of amber LEDs still remains the lowest among the visible wavelength range (DOE BTO Solid-State Lighting Program, "2022 DOE SSL R&D Opportunities"). InGaN quantum wells (QWs) based light emitting diodes face one fundamental challenge caused by the large polarization-induced electric field due to the asymmetric wurtzite crystal structure (spontaneous polarization) and strained QWs (piezoelectric polarization). This leads to the separation of the electron and hole wavefunction and reduction in charge carrier radiative recombination rate (Bernardini et al. *Phys. Rev. B* 2001, 63, 193201). InGaN QWs LEDs with the emission wavelength beyond blue and green are more susceptible to the detrimental effects of the internal electrostatic field, since relatively higher In content and thicker QWs are required (Damilano et al. *J. Phys. Appl. Phys.* 2015, 48, 403001).

Previously, LED structures grown along the non-polar, such as a- and m-planes, or semi-polar orientations (DOE BTO Solid-State Lighting Program, "2022 DOE SSL R&D Opportunities"; Schmidt et al. *Jpn. J. Appl. Phys.* 2007, 46, L190; Farrell et al. *Jpn. J. Appl. Phys.* 2007, 46, L761), were intended to remove or reduce the large polarization field in the InGaN QWs. Other approaches reported to overcome this challenge include QW designs such as staggered InGaN QW (Zhao et al. *IEEE J. Sel. Top. Quantum Electron.* 2009, 15, 1104; Zhao et al. *Opt. Express* 2011, 19, A991; Park et al. *Appl. Phys. Lett.* 2009, 94, 041109; Arif et al. *IEEE J. Quantum Electron.* 2008, 44, 573), strain-compensated InGaN—AlGaN QW (Zhao et al. *IEEE J. Quantum Electron.* 2009, 45, 66; Zhao et al. *Opt. Quantum Electron.* 2008, 40, 301), type-II InGaN—GaAsN QW (Arif et al. *Appl. Phys. Lett.* 2008, 92, 011104; Park et al. *Opt. Quantum Electron.* 2009, 41, 779), InGaN-delta-InN QW (Zhao et al. *Appl. Phys. Lett.* 2010, 97, 131114), and InGaN QW with delta-AlGaN layer (Park et al. *Appl. Phys. Lett.* 2006, 88, 202107; Park et al. *Appl. Phys. Lett.* 2007, 90, 023508). Band structure engineering in these QWs leads to the shift of the electron and hole wavefunction and thus improve the electron-hole wavefunction overlap and radiative recombination rate. Significant enhancement of the internal quantum efficiency (IQE) of InGaN QWs has also been reported recently by forming the 'V-pits' (Marcinkevičius et al. *Appl. Phys. Lett.* 2021, 119, 071102) at threading dislocations. In-rich clusters (Wu et al. *Appl. Phys. Lett.* 1998, 72, 692) can create potential barriers around the dislocations that suppress the nonradiative recombination (Hangleiter et al. *Phys. Rev. Lett.* 2005, 95, 127402). However, high-In composition or thick QWs are still needed for these QW designs when pushing for longer emission wavelength, which leads to limited radiative efficiency. In addition, rare-earth doped (Er, Eu) GaN was studied as an active region for green and red emission (Heikenfeld et al. *Appl. Phys. Lett.* 2000, 76, 1365; Morishima et al. *Phys. Status Solidi A* 1999, 176, 113;

Fragkos et al. *Sci. Rep.* 2018, 8, 13365; Fragkos et al. *Sci. Rep.* 2017, 7, 1; Timmerman et al. *Phys. Rev. Appl.* 2020, 13, 014044).

It was recently reported that a strategic insertion of a mono-layer ZnGeN$_2$ or ZnSnN$_2$ layer into the InGaN QW, i.e., the InGaN—ZnGeN$_2$, InGaN—ZnSnN$_2$ type-II QW structures, show great improvement in the radiative efficiency in InGaN based LEDs (Han et al. *J. Appl. Phys.* 2016, 120, 103102; Karim et al. *J. Appl. Phys.* 2018, 124, 034303). A successful insertion of a thin ZnGeN$_2$ layer into InGaN QWs has also been experimentally demonstrated (Karim et al. *Cryst. Growth Des.* 2021, 22, 131). On the other hand, the large conduction band offset between InGaN and ZnGeN$_2$ weakens the confinement of the electron wavefunction in the ZnGeN$_2$ layer, which limits the radiative recombination between electrons and holes. ZnSnN$_2$ features a more favorable alignment in both valence band and conduction band with GaN (Punya et al. *Phys. Rev. B* 2013, 88, 075302; Jaroenjittichai et al. *Phys. Rev. B* 2017, 96, 079907), which retains the strong confinement for hole wavefunction in the valence band, without sacrificing the confinement of the electron wavefunction in the conduction band. Therefore, a large electron-hole wavefunction overlap and high IQE can be achieved for LEDs with longer peak emission wavelength (~600 nm) (Karim et al. *J. Appl. Phys.* 2018, 124, 034303). However, the insertion of a ZnSnN$_2$ monolayer into the InGaN QW can be challenging due to the relatively low MOCVD growth temperature required for ZnSnN$_2$. Recently, a pulsed-mode MOCVD growth method has been implemented to address the formation of Sn droplets at higher growth temperatures for ZnSnN$_2$ and a stoichiometric ZnSnGa$_2$N$_4$ alloy was achieved (Zhang et al. *Cryst. Growth Des.* 2022, 22, 5004). The experimentally determined band offsets with GaN ($\Delta E_V$=0.96 eV and $\Delta E_C$=0.18 eV) (Zhang et al. *Cryst. Growth Des.* 2022, 22, 5004) shows a promising heterostructure of the type-II InGaN—ZnSnGa$_2$N$_4$ QW with enhanced radiative efficiency at long emission wavelength.

In this study, the design of type-II InGaN—ZnSnGa$_2$N$_4$ QW structure targeting for high efficiency amber LEDs using a self-consistent 6-band k p method is described (Zhao et al. *IEEE J. Quantum Electron.* 2009, 45, 66). Band structure calculations were conducted by taking into account the polarization field, strain effect, and carrier screening effect. The spontaneous emission radiative recombination rates were calculated for both the InGaN—ZnSnGa$_2$N$_4$ QW and the conventional InGaN QW emitting at ~590 nm and the QW design described herein shows a ~14 times enhancement at carrier concentrations ranging from 1-5×10$^{18}$ cm$^{-3}$.

Figure 19:
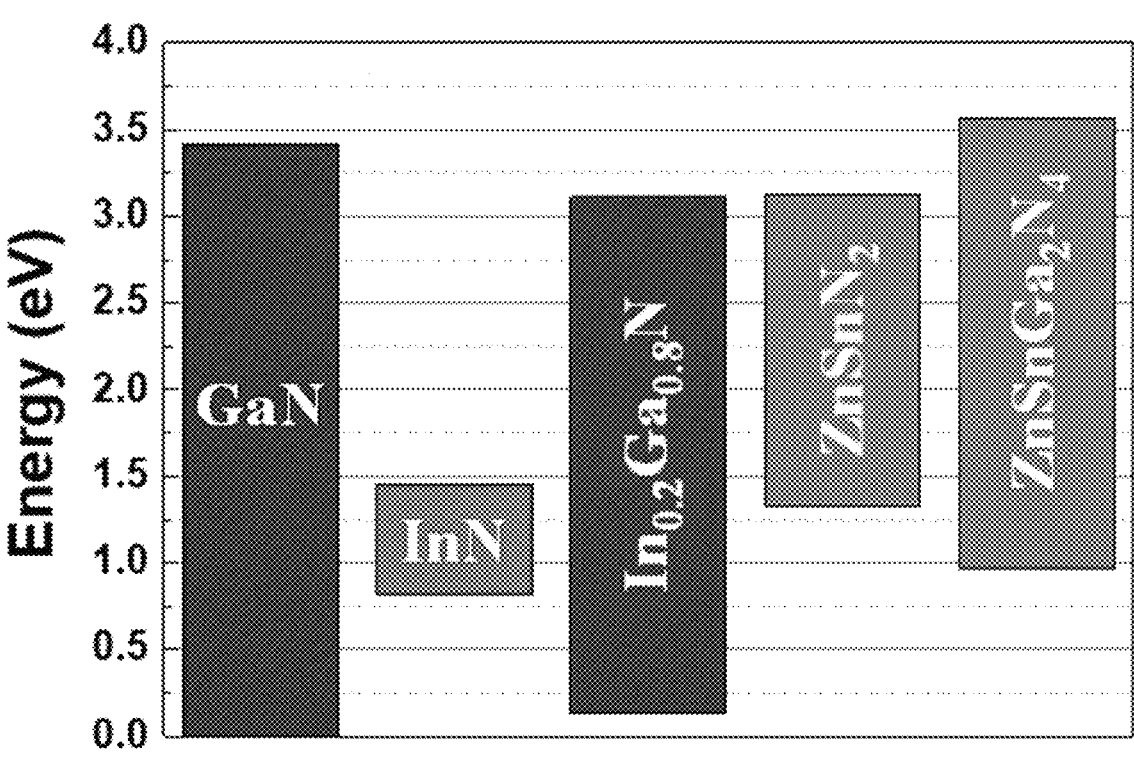
FIG. 19. Bandgap alignments of InN, $In_{0.2}Ga_{0.8}N$, $ZnSnN_2$, and $ZnSnGa_2N_4$ (e.g. $(ZnSn)_{0.5}GaN_2$) with respect to GaN showing conduction and valence band offsets.
Figure 20:
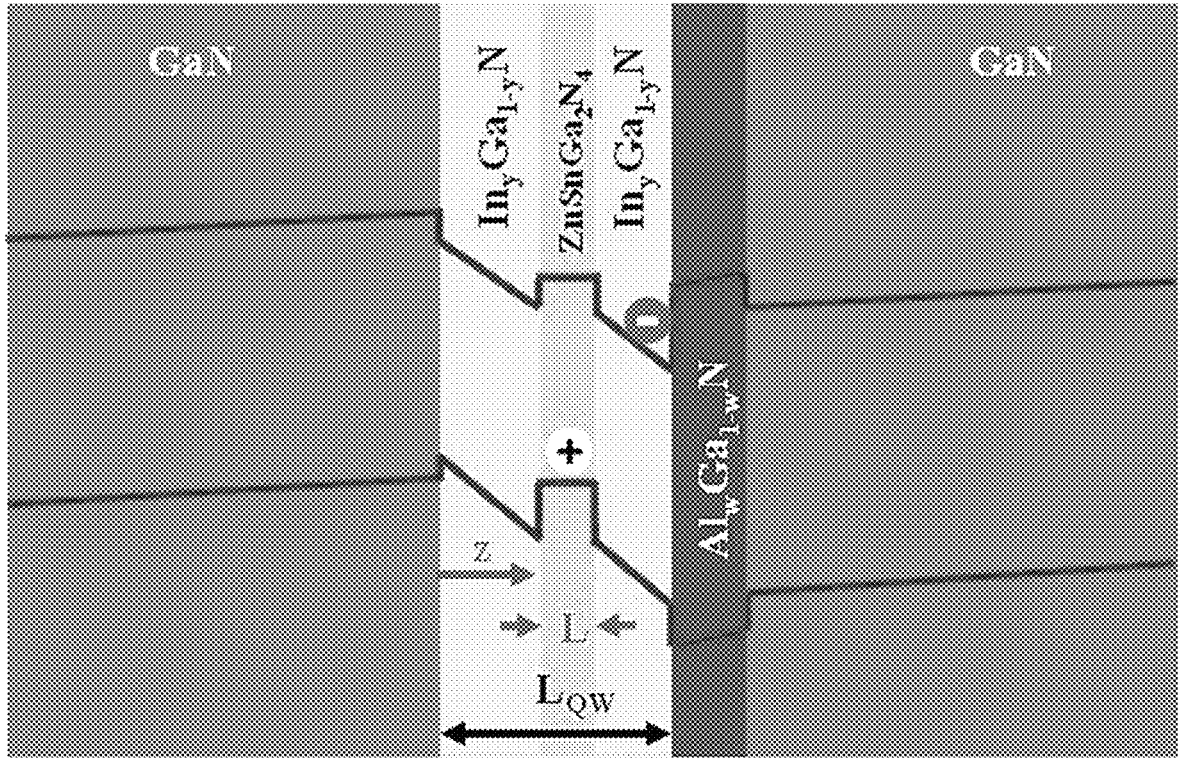
FIG. 20. A schematic diagram of the proposed InGaN/$ZnSnGa_2N_4$/AlGaN quantum wells with the width of the quantum well ($L_{QW}$), the position of the ZTGN layer (Z), and the thickness of the ZTGN layer (L) indicated.

Concept and design details. In this design, a thin layer of ZnSnGa$_2$N$_4$ is inserted in the active region to function as a hole confinement layer. The band alignments of ZnSnGa$_2$N$_4$ and ZnSnN$_2$ with unstrained GaN, InN and In$_{0.2}$Ga$_{0.8}$N are shown in FIG. 19. The band offset between ZnSnGa$_2$N$_4$ and GaN was determined using XPS measurement (Zhang et al. *Cryst. Growth Des.* 2022, 22, 5004) while the band offset value between ZnSnN$_2$ and GaN is from first principle calculations (Punya et al. *Phys. Rev. B* 2013, 88, 075302; Jaroenjittichai et al. *Phys. Rev. B* 2017, 96, 079907). The unique band alignment leads to a strong hole confinement in the ZnSnGa$_2$N$_4$ layer. A schematic drawing of the proposed design is shown in FIG. 20. The thin AlGaN layer can better confine the electron wavefunction in the QW active region. While the peak emission wavelength ($\lambda_p$) of a conventional InGaN (IGN) QW depends on the In content and the thickness of the QW, the InGaN—ZnSnGa$_2$N$_4$ (IGN-ZTGN) based QW structure brings more flexibility and allows a wider range of tuning for $\lambda_p$ by tuning the thickness and position of the $ZnSnGa_2N_4$ layer within the InGaN QW.

A self-consistent 6-band k p method was used to obtain the band structure of the proposed IGN-ZTGN QW as well as the conventional QW. A 6×6 diagonalized k p Hamiltonian was used to determine the hole energy bands. A parabolic band structure was assumed for the electrons in the conduction band. The effects of strain, spontaneous and piezoelectric polarization, carrier screening, and valence band mixing were taken into account. The spontaneous polarization for $ZnSnGa_2N_4$ were also taken into consideration. Since the structure was proposed for LED applications the radiative recombination properties were studied at carrier densities of $1-5\times10^{18}$ cm$^{-3}$.

In order to calculate the band structure, Poisson's equation was iteratively solved until convergence was achieved. Solving the Schrödinger equation and Poisson's equation self-consistently yielded the confined energy levels and wavefunctions. The spatial overlap between the normalized envelop functions were calculated to obtain overlap between electron and hole wavefunctions. In the calculation of spontaneous emission rate, both TE and TM polarizations were taken into account. A detailed description of the numerical formalism is provided elsewhere (Zhao et al. *IEEE J. Quantum Electron.* 2009, 45, 66). Table 2 summarizes the parameter values used in the simulation, using the same notations as used elsewhere (Zhao et al. *IEEE J. Quantum Electron.* 2009, 45, 66).

TABLE 2

Material parameters of GaN*, InN**,
and ZnSnGa2N4 used in the simulation.

| Parameter | GaN | InN | $ZnSnGa_2N_4$ |
|---|---|---|---|
| Lattice constant (Å) | | | |
| a | 3.189 | 3.545 | 3.245 |
| c | 5.185 | 5.703 | 5.324 |
| Energy Parameters (eV) | | | |
| Eg at 300K | 3.42 | 0.6405 | 2.6 |
| $\Delta_1(=\Delta_{cr})$ | 0.01 | 0.024 | 0.049 |
| $\Delta_1 = \Delta_1 = \Delta_{so}/3$ | 0.00567 | 0.00167 | 0.00284 |
| Conduction band offset with GaN (eV) | | $0.7\Delta_{Eg}$ | 0.16 |
| Valence band offset with GaN (eV) | | $0.3\Delta_{Eg}$ | 0.96 |
| Conduction-band effective masse | | | |
| $m_{\parallel}*/m_0$ at 300K | 0.21 | 0.07 | 0.17 |
| $m_{\perp}*/m_0$ at 300K | 0.2 | 0.07 | 0.185 |
| Valence band effective mass parameters | | | |
| $A_1$ | 7.24 | 9.24 | 7.74 |
| $A_2$ | 0.51 | 0.6 | 0.5 |
| $A_3$ | 6.73 | 8.68 | 7.25 |
| A4 | 3.36 | 4.34 | 3.08 |
| $A_5$ | 3.4 | 5.11 | 3.1 |
| $A_6$ | -4.9 | -5.96 | -0.505 |
| Elastic stiffness coefficients (GPa) | | | |
| $C_{11}$ | 390 | 223 | 331 |
| $C_{12}$ | 145 | 115 | 136.5 |

TABLE 2-continued

Material parameters of GaN*, InN**,
and ZnSnGa2N4 used in the simulation.

| Parameter | GaN | InN | $ZnSnGa_2N_4$ |
|---|---|---|---|
| $C_{13}$ | 106 | 92 | 103 |
| $C_{33}$ | 398 | 224 | 352 |
| Spontaneous polarization (C/m$^2$) | 0.034 | 0.042 | 0.0315 |
| Piezoelectric coefficients (pm V$^{-1}$) | | | |
| $d_{13}$ | 1 | 3.5 | 1.95 |
| $d_{33}$ | 1.9 | 7.6 | 3.65 |

*Vurgaftman et al. *Nitride Semicond. Devices Princ. Simul.* John Wiley & Sons, Ltd, 2007, pp. 13-48
**Vurgaftman et al. *J. Appl. Phys.* 2003, 94, 3675

In Table 2, the band offsets values for $ZnSnGa_2N_4$ with GaN were obtained based on experimental results (Zhang et al. *Cryst. Growth Des.* 2022, 22, 5004) and the other parameters were determined by taking a linear dependence of the alloy composition based on the values for $ZnSnN_2$ and GaN (Punya et al. Phys. Rev. B 2013, 88, 075302; Jaroenjittichai et al. *Phys. Rev. B* 2017, 96, 079907; *III-Nitride Semiconductors and Their Modern Devices*, Oxford University Press, Oxford, New York, 2013; Park et al. *Phys. Rev. B* 1999, 59, 4725; Punya et al. *Phys. Status Solidi C* 2011, 8, 2492).

Figure 21A:
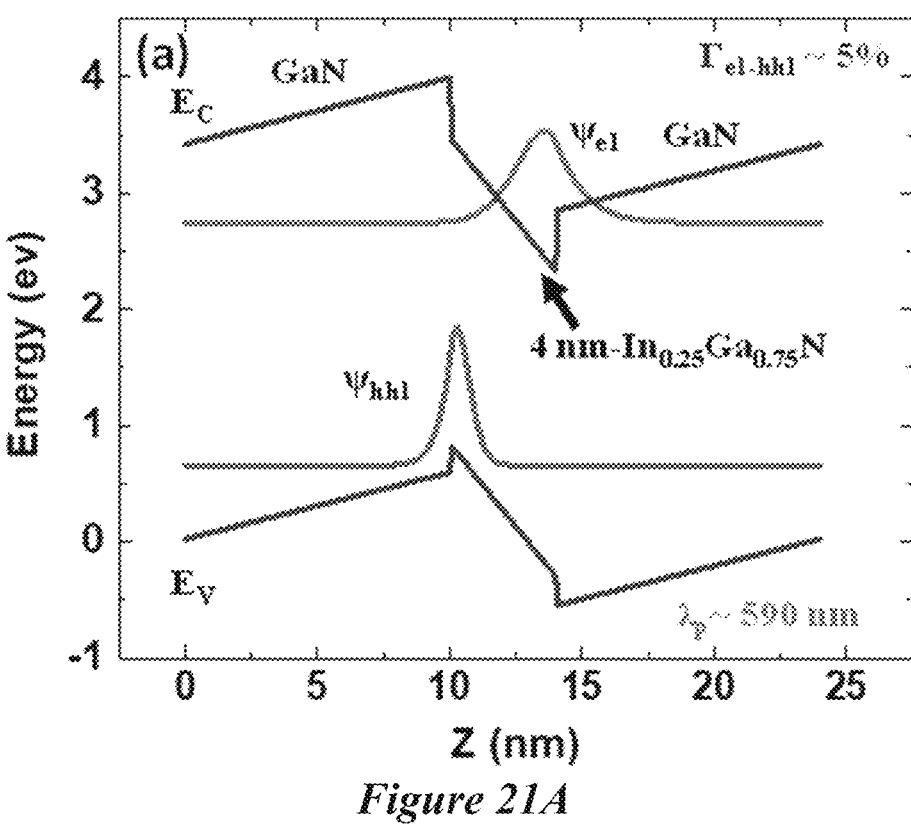
FIG. 21A. Band alignment and electron and hole wavefunctions for the first confined energy states in a conventional GaN/4 nm $In_{0.25}Ga_{0.75}N$/GaN QW designed for 590 nm peak spontaneous emission wavelength.
Figure 21B:
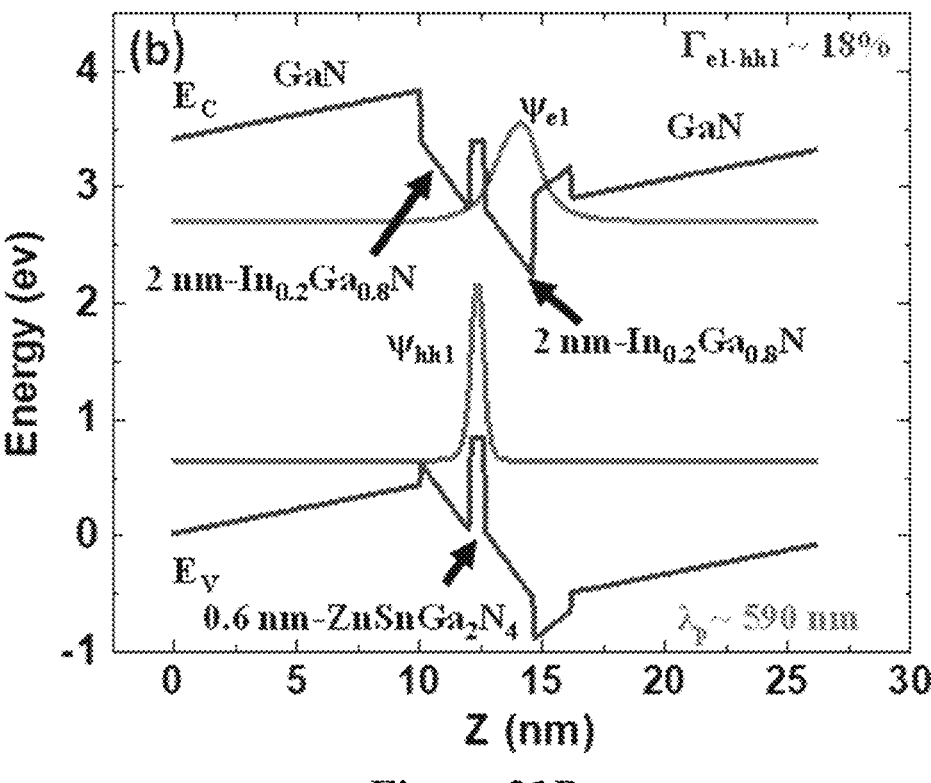
FIG. 21B. Band alignment and electron and hole wavefunctions for the first confined energy states in a GaN/2 nm $In_{0.2}Ga_{0.8}N$/0.6 nm $ZnSnGa_2N_4$/2 nm $In_{0.2}Ga_{0.8}N$/1.5 nm $Al_{0.2}Ga_{0.8}N$/GaN QW designed for 590 nm peak spontaneous emission wavelength.

Band diagram and spontaneous emission properties. The band structure of the conduction and valence bands for the conventional 4 nm $In_{0.25}Ga_{0.75}N(IGN)$ QW and the 2 nm $In_{0.2}Ga_{0.8}N$-0.6 nm $ZnSnGa_2N_4$-2 nm $In_{0.2}Ga_{0.8}N$-1.5 nm $Al_{0.2}Ga_{0.8}N(IGN$-ZTGN) QW are plotted in FIG. 21A and FIG. 21B, respectively. Both structures were designed to have a peak emission wavelength of ~590 nm. The corresponding electron wavefunction ($\psi_{e1}$) and hole wavefunction ($\psi_{hh1}$) for the first confined conduction energy states are also plotted. As shown in FIG. 21A, the IGN QW exhibits a severe band bending and the electron and hole wavefunctions are spatially separated. As a result, the electron-hole wavefunction overlap $\Gamma_{e1-hh1}$ is calculated to be only 5%. However, the IGN-ZTGN QW shown in FIG. 21B has a strong hole wavefunction confinement and an enhanced electron-hole wavefunction overlap of 18%. It is worth noting that the In composition in the InGaN layers for the IGN-ZTGN QW is 20%, which is lower than that of the conventional IGN QW (25%). Consequently, one expects that this structure will eventually reduce the efficiency droop caused by the high In content at longer emission wavelengths.

Figure 22A:
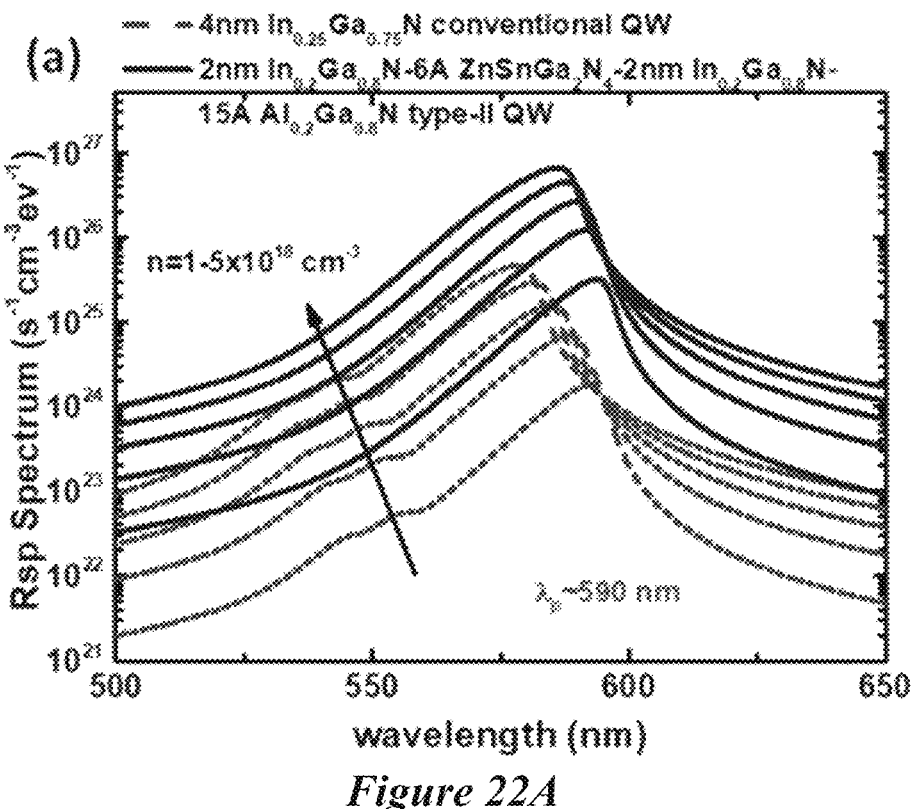
FIG. 22A. Spontaneous emission spectra of conventional GaN/4 nm $In_{0.25}Ga_{0.75}N$/GaN (dashed lines) and GaN/2 nm $In_{0.2}Ga_{0.8}N$/0.6 nm $ZnSnGa_2N_4$/2 nm $In_{0.2}Ga_{0.8}N$/1.5 nm $Al_{0.2}Ga_{0.8}N$/GaN (solid lines) QWs for carrier concentrations $1-5\times10^{18}$ cm$^{-3}$. Both QWs were designed with 590 nm peak emission wavelength at $1\times10^{18}$ cm$^{-3}$ carrier concentration.

The spontaneous emission spectra of the IGN-ZTGN QW were calculated for carrier concentrations at $1-5\times10^{18}$ cm$^{-3}$ and compared to those of the conventional IGN QW. As shown in FIG. 22A, both QW structures show a peak emission wavelength of ~590 nm at the carrier density of $1\times10^{18}$ cm$^{-3}$. The peak spontaneous emission intensity ($I_p$) for the IGN QW increases from $5.0\times10^{26}$ s$^{-1}$ cm$^{-3}$ eV$^{-1}$ to $1.2\times10^{28}$ s$^{-1}$ cm$^{-3}$ eV$^-$ with the increase in carrier concentration from $1\times10^{18}$ cm$^{-3}$ to $5\times10^{18}$ cm$^{-3}$ while the $I_p$ of IGN-ZTGN QW increases from $2.0\times10^{25}$ s$^{-1}$ cm$^{-3}$ eV$^{-1}$ to $5.9\times10^{26}$ s$^{-1}$ cm$^{-3}$ eV$^{-1}$, which is equivalent to an enhancement of approximately 17 to 25 times. According to Fermi's golden rule, the enhanced $I_p$ is due to the increased electron-hole wavefunction overlap in the IGN-ZTGN QW active region.

Figure 22B:
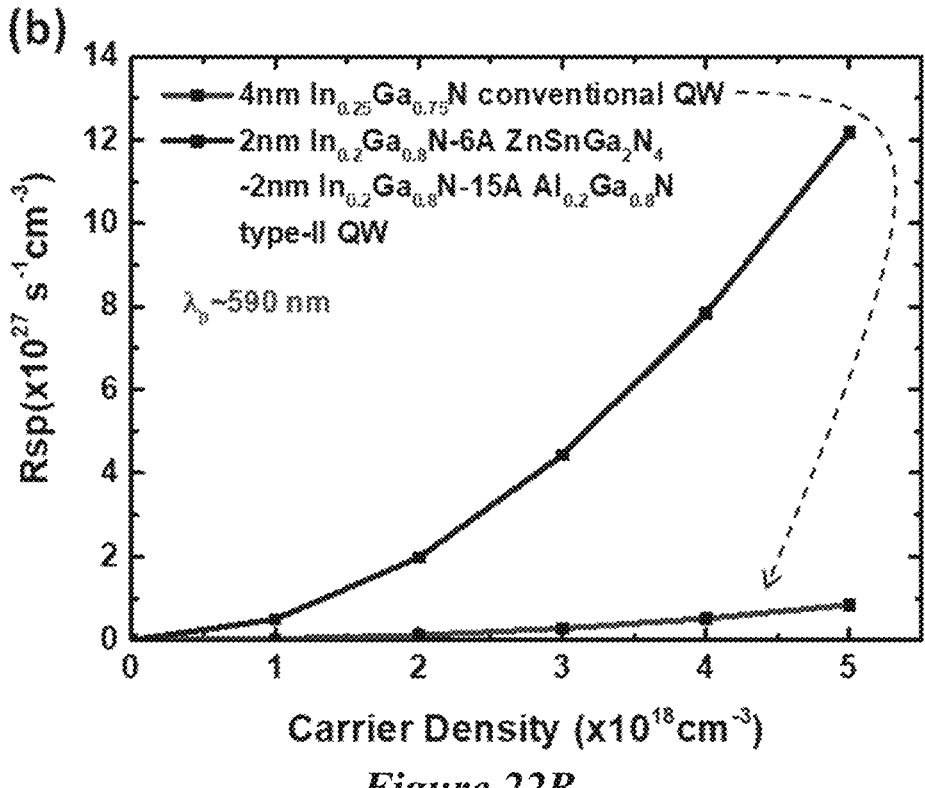
FIG. 22B. Spontaneous emission radiative recombination rates of conventional GaN/4 nm $In_{0.25}Ga_{0.75}N$/GaN (dashed lines) and GaN/2 nm $In_{0.2}Ga_{0.8}N$/0.6 nm $ZnSnGa_2N_4$/2 nm $In_{0.2}Ga_{0.8}N$/1.5 nm $Al_{0.2}Ga_{0.8}N$/GaN (solid lines) QWs for carrier concentrations $1-5\times10^{18}$ cm$^{-3}$. Both QWs were designed with 590 nm peak emission wavelength at $1\times10^{18}$ cm$^{-3}$ carrier concentration.

The spontaneous emission radiative recombination rate per unit volume, $R_{sp}$, is calculated by integrating the spontaneous emission spectrum over the entire wavelength range. As shown in FIG. 22B, the $R_{sp}$ increases monotonically with the increase in carrier concentration for both QW structures. The IGN-ZTGN QW provides around 14 times enhancement of $R_{sp}$ as compared to that of the IGN QW. Quantitatively, the $R_{sp}$ of the IGN-ZTGN QW increases from $5.0 \times 10^{26}$ s$^{-1}$ cm$^{-3}$ to $1.2 \times 10^{28}$ s$^{-1}$ cm$^{-3}$ for carrier concentration at $1\text{-}5 \times 10^{18}$ cm$^{-3}$, whereas the $R_{sp}$ of the IGN QW is limited to $2.7 \times 10^{25}$ s$^{-1}$ cm$^{-3}$ to $8.5 \times 10^{26}$ s$^{-1}$ cm$^{-3}$. Note that the IQE of an LED is determined by the ratio of the radiative recombination rate to the total recombination rate, which includes both the radiative and nonradiative components. In this case, an even better performance in IQE can be expected for the QW design described herein considering the lower nonradiative recombination expected in the IGN-ZTGN QW due to the lower In content InGaN grown at relatively high temperature. Moreover, this structure should be ready for the MOCVD epitaxy based on the recently established pulsed mode growth of stochiometric ZnSnGa$_2$N$_4$ films on GaN (Zhang et al. *Cryst. Growth Des.* 2022, 22, 5004).

Conclusion. In conclusion, the simulation of a QW design for amber LEDs using InGaN—ZnSnGa$_2$N$_4$ QW active layer is studied. The experimentally measured band offset between ZnSnGa$_2$N$_4$ and GaN is used in the simulation. A strong confinement of the hole wavefunction is achieved by inserting a thin layer of ZnSnGa$_2$N$_4$ into the InGaN QW due to the large valence band offset. As a result, the peak spontaneous emission intensity and the spontaneous emission radiative recombination rate of the InGaN—ZnSnGa$_2$N$_4$ QW have shown about 17-25-times and 14-times enhancement as compared to those of the conventional InGaN QW. In addition, benefiting from the smaller bandgap of ZnSnGa$_2$N$_4$ and the large valence band offset with GaN, lower In-content in the InGaN layer is needed to achieve the amber emission around 590 nm. The proposed InGaN—ZnSnGa$_2$N$_4$ QW structure shows great potential to address the challenge of improving the efficiency in InGaN QW based LEDs emitting beyond green. It is promising to develop high performance III-nitride based LEDs emitting through the entire visible wavelength regime based on this design.

Other advantages which are obvious and which are inherent to the invention will be evident to one skilled in the art. It will be understood that certain features and sub-combinations are of utility and may be employed without reference to other features and sub-combinations. This is contemplated by and is within the scope of the claims. Since many possible embodiments may be made of the invention without departing from the scope thereof, it is to be understood that all matter herein set forth or shown in the accompanying drawings is to be interpreted as illustrative and not in a limiting sense.

The methods of the appended claims are not limited in scope by the specific methods described herein, which are intended as illustrations of a few aspects of the claims and any methods that are functionally equivalent are intended to fall within the scope of the claims. Various modifications of the methods in addition to those shown and described herein are intended to fall within the scope of the appended claims. Further, while only certain representative method steps disclosed herein are specifically described, other combinations of the method steps also are intended to fall within the scope of the appended claims, even if not specifically recited. Thus, a combination of steps, elements, components, or constituents may be explicitly mentioned herein or less, however, other combinations of steps, elements, components, and constituents are included, even though not explicitly stated.

What is claimed is:

1. A photonic material, comprising:
a first layer comprising In$_y$Ga$_{1-y}$N, wherein y is from 0 to 0.8;
a second layer comprising (Zn$_a$Sn$_b$Ge$_c$)$_x$Ga$_d$N$_2$, wherein:
x is from greater than 0 to 1;
a, b, c, and d are each independently from 0 to 1;
with the proviso that at least one of a, b, or c is greater than 0; and
a third layer comprising In$_z$Ga$_{1-z}$N, wherein z is from 0 to 0.8;
wherein the second layer is disposed between and in contact with the first layer and the third layer, such that the second layer is sandwiched between the first layer and the third layer;
wherein the first layer has a first average thickness, the second layer has a second average thickness, and the third layer has a third average thickness.

2. The photonic material of claim 1, wherein y and/or z is from 0.1 to 0.5.

3. The photonic material of claim 1, wherein the first average thickness is from 0.1 nm to 5 nm.

4. The photonic material of claim 1, wherein the second average thickness is from 0.1 nm to 5 nm.

5. The photonic material of claim 1, wherein the second layer comprises (ZnSn)$_{0.5}$GaN$_2$.

6. The photonic material of claim 1, wherein d is equal to 1-x, such that the second layer comprises (Zn$_a$Sn$_b$Ge$_c$)$_x$Ga$_{1-x}$N$_2$.

7. The photonic material of claim 1, wherein the second layer comprises (ZnSn)$_{0.5}$Ga$_{0.5}$N$_2$.

8. The photonic material of claim 1, wherein the third average thickness is from 0.1 nm to 5 nm.

9. The photonic material of claim 1, wherein the photonic material has an average composite thickness of from 0.5 nm to 10 nm, wherein the average composite thickness is the sum of the first average thickness, the second average thickness, and the third average thickness.

10. The photonic material of claim 1, wherein the photonic material has an electron wavefunction with a first confined state and a hole wavefunction with a first confined state, and wherein the overlap of the electron wavefunction and the hole wavefunction in the first confined state in the photonic material is 1% or more.

11. The photonic material of claim 1, wherein the photonic material has a spontaneous emission spectrum with a peak wavelength of 500 nm or more.

12. The photonic material of claim 1, wherein:
the photonic material has a spontaneous emission recombination rate per unit volume of $1 \times 10^{25}$ s$^{-1}$ cm$^{-3}$ or more at a carrier concentration of from $1 \times 10^{18}$ cm$^{-3}$ to $5 \times 10^{18}$ cm$^{-3}$;
the spontaneous emission spectrum of the photonic material exhibits a peak wavelength of 500 nm or more and the peak wavelength has an intensity of $1 \times 10^{25}$ s$^{-1}$ cm$^{-3}$ eV$^{-1}$ or more at a carrier concentration of from $1 \times 10^{18}$ cm$^{-3}$ to $5 \times 10^{18}$ cm$^{-3}$;
or a combination thereof.

13. The photonic material of claim 1, further comprising a sixth layer disposed on the first layer, such that the first layer is sandwiched between the sixth layer and the second layer, wherein the sixth layer comprises GaN.

14. The photonic material of claim 13, wherein the sixth layer has a sixth average thickness of from 1 nm to 15 nm.

15. The photonic material of claim 1, further comprising a fourth layer disposed on the third layer, such that the third layer is sandwiched between the second layer and the fourth layer, wherein the fourth layer comprises $Al_w Ga_{1-w}N$ and w is from 0 to 1.

16. The photonic material of claim 15, wherein the fourth layer has a fourth average thickness of from 0.5 nm to 5 nm.

17. The photonic material of claim 15, further comprising a fifth layer disposed on the fourth layer, such that the fourth layer is sandwiched between the fifth layer and the third layer, wherein the fifth layer comprises GaN.

18. The photonic material of claim 17, wherein the fifth layer has a fifth average thickness of from 1 nm to 15 nm.

\* \* \* \* \*